(12) United States Patent
Kim et al.

(10) Patent No.: US 9,153,597 B2
(45) Date of Patent: Oct. 6, 2015

(54) METHODS OF MANUFACTURING A THREE-DIMENSIONAL SEMICONDUCTOR DEVICE

(75) Inventors: Young-Hoo Kim, Anyang-si (KR); Sang Won Bae, Incheon (KR); Kuntack Lee, Suwon-si (KR); Hyosan Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 183 days.

(21) Appl. No.: 13/616,254

(22) Filed: Sep. 14, 2012

(65) Prior Publication Data

US 2013/0078776 A1 Mar. 28, 2013

(30) Foreign Application Priority Data

Sep. 23, 2011 (KR) ........................ 10-2011-0096129

(51) Int. Cl.
| | |
|---|---|
| H01L 21/336 | (2006.01) |
| H01L 27/115 | (2006.01) |
| H01L 21/3105 | (2006.01) |
| H01L 21/311 | (2006.01) |

(52) U.S. Cl.
CPC ...... *H01L 27/11582* (2013.01); *H01L 21/3105* (2013.01); *H01L 21/31111* (2013.01); *H01L 27/11556* (2013.01)

(58) Field of Classification Search
CPC ..................... H01L 21/31111; H01L 21/3105; H01L 21/3043; H01L 21/30608; H01L 27/11556; H01L 27/11582; H01L 29/7926; H01L 29/66833

USPC ......... 438/216, 264, 268, 269, 270, 287, 591, 438/595; 257/302, 324, 328, E21.41, 257/E29.262

See application file for complete search history.

(56) References Cited

U.S. PATENT DOCUMENTS

| | | | | |
|---|---|---|---|---|
| 8,026,150 | B2 * | 9/2011 | Sasahara et al. | 438/422 |
| 8,187,938 | B2 * | 5/2012 | Lim et al. | 438/269 |
| 2002/0125520 | A1 * | 9/2002 | Liu | 257/300 |
| 2004/0029382 | A1 * | 2/2004 | Kawase | 438/689 |
| 2004/0048200 | A1 | 3/2004 | Ishibashi | |
| 2007/0042598 | A1 * | 2/2007 | Park | 438/634 |
| 2007/0077782 | A1 * | 4/2007 | Lee et al. | 438/781 |
| 2009/0179003 | A1 * | 7/2009 | Nishimura | 216/41 |
| 2010/0148237 | A1 | 6/2010 | Kito | |
| 2010/0178755 | A1 * | 7/2010 | Lee et al. | 438/479 |
| 2010/0330789 | A1 * | 12/2010 | Hyun | 438/585 |
| 2011/0143524 | A1 * | 6/2011 | Son et al. | 438/479 |
| 2012/0045581 | A1 * | 2/2012 | Kimura et al. | 427/248.1 |

FOREIGN PATENT DOCUMENTS

| | | |
|---|---|---|
| JP | 2004-103926 A | 4/2004 |
| JP | 2010-147125 A | 7/2010 |
| KR | 10-2004-0026103 A | 3/2004 |
| KR | 10-2010-0083629 A | 7/2010 |

* cited by examiner

*Primary Examiner* — Khiem D Nguyen
(74) *Attorney, Agent, or Firm* — Myers Bigel Sibley & Sajovec, PA

(57) ABSTRACT

The inventive concept provides methods of manufacturing three-dimensional semiconductor devices. In some embodiments, the methods include forming a stack structure including sacrificial layers and insulation layers, forming a trench penetrating the stack structure, forming a hydrophobic passivation element on the surfaces of the insulation layers that were exposed by the trench and selectively removing the sacrificial layers.

14 Claims, 29 Drawing Sheets

METHODS OF MANUFACTURING A THREE-DIMENSIONAL SEMICONDUCTOR DEVICE

CROSS-REFERENCE TO RELATED APPLICATION

This application claims priority under 35 U.S.C. §119 to Korean Patent Application No. 10-2011-0096129, filed on Sep. 23, 2011, the disclosure of which is hereby incorporated by reference in its entirety.

FIELD OF THE INVENTION

The inventive concept relates to methods of manufacturing a semiconductor device and, more particularly, to methods of manufacturing a three-dimensional semiconductor device.

BACKGROUND

As semiconductor devices have become more highly integrated, the integration density of semiconductor devices has progressively increased. In two dimensional semiconductor devices (i.e., planar semiconductor devices), integration density can be limited by the planar area of the device and the ability to form fine patterns within that planar area. Recently, semiconductor devices comprising memory cells arranged in a three-dimensional array have been proposed to overcome the aforementioned limitations. Nevertheless, new processes that are capable of realizing reliable products are still required for successful mass production of three-dimensional semiconductor memory devices.

The inventive concept provides methods of manufacturing three-dimensional semiconductor devices and devices formed using such methods.

SUMMARY

Exemplary embodiments of the inventive concept provide methods of manufacturing a three-dimensional semiconductor device. In example embodiments, the method comprises forming a stack structure on a substrate, forming a plurality of openings in said stack structure, forming a plurality of semiconductor elements in said stack structure, forming a trench in said stack structure, forming one or more passivation elements in said stack structure, forming one or more recessed regions in said stack structure, removing said passivation element(s); forming one or more data storage elements in said stack structure and/or forming one or more conductive elements in said stack structure. In some embodiments, the stack structure comprises a plurality of sacrificial layers and a plurality of insulation layers, wherein the sacrificial layers and the insulation layers are alternately stacked such that at least one sacrificial layer is interposed between each insulation layer and the next insulation layer in the stack, and each recessed region is formed by removing at least a portion of one of said plurality of sacrificial layers. In some embodiments, the trench and the passivation element(s) are formed concurrently. In some embodiments, the passivation element(s) and the recessed region(s) are formed concurrently.

Exemplary embodiments of the inventive concept provide methods of increasing the etch selectivity between a sacrificial layer and an insulating layer. In example embodiments, the method comprises forming a passivation element on at least a portion of said insulating layer, thereby increasing the resistivity of the insulation layer to an etching agent.

Exemplary embodiments of the inventive concept provide passivation elements that may be useful in the methods of the inventive concept. In example embodiments, one or more of the passivation elements comprises a hydrophobic material. In example embodiments, one or more of the passivation elements comprises a silicon oxide containing at least one Si—$C_xH_y$ bond and at least one Si—O bond (e.g., —O—Si—$(C_xH_y)_3$) In example embodiments, one or more of the passivation elements is formed by reacting one or more hydroxyl (—OH) groups on the surface of an insulation layer with a silicon-containing passivation agent and/or by reacting one or more hydroxyl (—OH) groups on the surface of an insulation layer with a passivation agent comprising one or more hydrocarbons ($C_xH_y$). In example embodiments, one or more of the passivation elements is formed using a gaseous passivation agent.

Exemplary embodiments of the inventive concept provide three-dimensional semiconductor devices produced by a method of the inventive concept.

Exemplary embodiments of the inventive concept provide an electronic system comprising one or more three-dimensional semiconductor devices of the inventive concept.

Exemplary embodiments of the inventive concept provide a memory card comprising one or more three-dimensional semiconductor devices of the inventive concept.

Exemplary embodiments of the inventive concept provide an information processing system comprising one or more three-dimensional semiconductor devices of the inventive concept.

BRIEF DESCRIPTION OF THE DRAWINGS

The foregoing and other aspects, features and advantages of the inventive concept will be apparent from the following detailed description of exemplary embodiments of the inventive concept, as illustrated in the accompanying drawings, in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
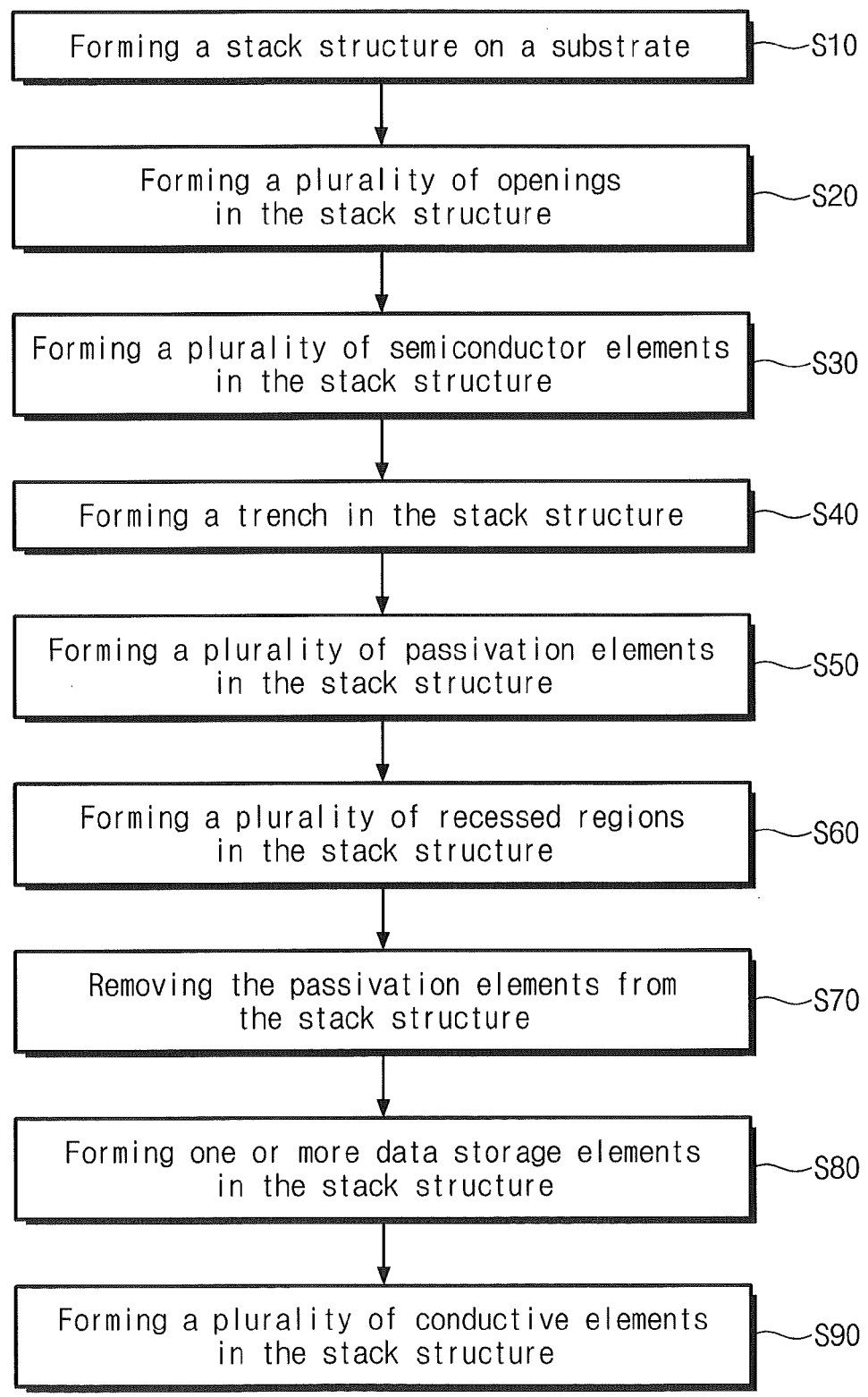
FIGS. 1A-1D are flowcharts describing methods of manufacturing a three-dimensional semiconductor device according to embodiments of the inventive concept.

Exemplary embodiments with be described more fully hereinafter with reference to the accompanying drawings, in which some example embodiments are shown. The present inventive concept may, however, be embodied in many alternate forms and should not be construed as limited to the example embodiments set forth herein. Rather, these embodiments are provided so that this description will be thorough and complete, and will fully convey the scope of the inventive concept to one skilled in the art.

In the drawings, the shapes and relative sizes of respective elements, components, layers, regions and sections may be exaggerated for clarity. Like numerals refer to like elements throughout. Names and functions of components not shown or not labeled with reference numerals will easily be understood from other drawings and descriptions contained herein.

The terminology used herein is for the purpose of describing particular embodiments only and is not intended to be limiting of the embodiments.

Unless otherwise defined, all terms used herein (including technical or scientific terms) have the same meanings as those which are generally understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms "first," "second," "third," etc. may be used herein to describe various elements, components, regions, layers and/or sections, such elements, components, regions, layers and/or sections are not limited by those terms. Unless the context clearly indicates otherwise indicated, the terms are used only to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments of the inventive concepts are described herein with reference to cross-sectional illustrations and/or perspective illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein, but are to include deviations in shapes that result, for example, from manufacturing. For example, an etched region illustrated as a rectangle may have rounded or curved features having a predetermined curvature. Thus, the regions illustrated in the figures are schematic in nature and their shapes are not intended to illustrate the actual shape of a region of a device and are not intended to limit the scope of exemplary embodiments.

As used herein, the singular forms "a," "an," and "the" are intended to include the plural forms as well, unless the context clearly indicates otherwise.

As used herein, the terms "comprise," "comprising," "include" "including" and grammatical variants thereof specify the presence of stated features, integers, steps, operations, elements, components, regions, layers and/or sections, but do not preclude the presence or addition of one or more other features, integers, steps, operations, elements, components, regions, layers, sections and/or groups thereof.

Hereinafter, exemplary embodiments of the inventive concept will be explained in detail with reference to the accompanying drawings.

As shown in FIGS. 1A-1D, a method of manufacturing a three-dimensional semiconductor device may comprise:

forming a stack structure on a substrate S10, said stack structure comprising one or more sacrificial layers and one or more insulation layers, wherein the sacrificial layer(s) and the insulation layer(s) are alternately stacked such that, if a plurality of insulation layers is included in the stack structure, at least one sacrificial layer is interposed between each insulation layer and the next insulation layer in the stack;

forming a plurality of openings in said stack structure S2;

forming a plurality of semiconductor elements in said stack structure S30, wherein each semiconductor element is formed in one of said plurality of openings;

forming a trench in said stack structure S40, wherein formation of said trench creates one or more exposed surfaces in each sacrificial layer and one or more exposed surfaces in each insulation layer (e.g., an exposed sidewall that borders the trench);

forming one or more passivation elements in said stack structure S50, wherein each passivation element is formed on one or more of the insulation layer surfaces that was exposed by formation of the trench;

forming a plurality of recessed regions in said stack structure S60, wherein each recessed region is formed by removing at least a portion of a sacrificial layer;

removing at least a portion of one or more of said passivation elements S70;

forming a plurality of data storage elements in said stack structure S80, wherein each said data storage elements is formed in one of said recessed regions; and/or forming a plurality of conductive elements in said stack structure S90, wherein each of said conductive elements is formed in one of said recessed regions.

Figure 1B:
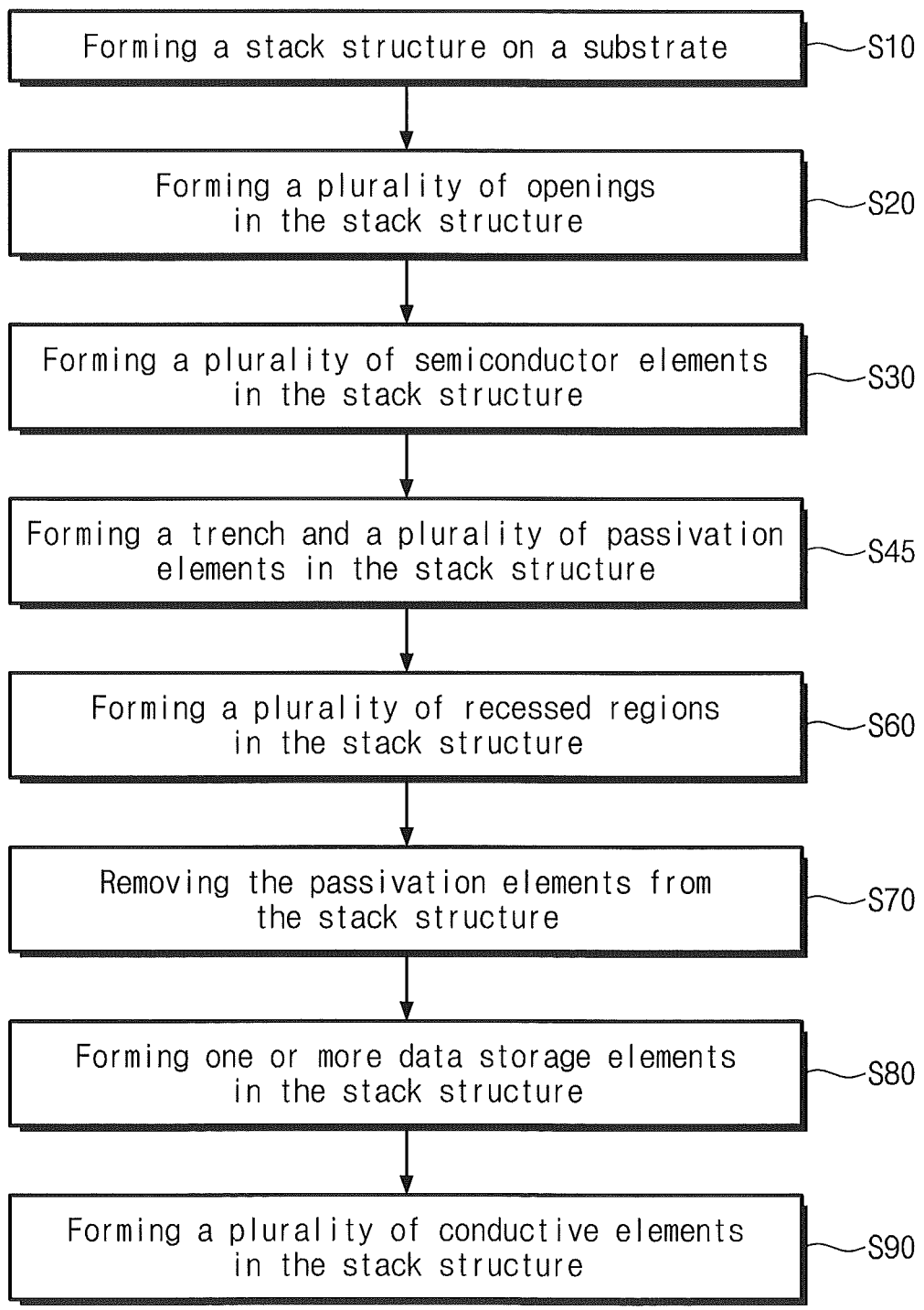
Figure 1C:
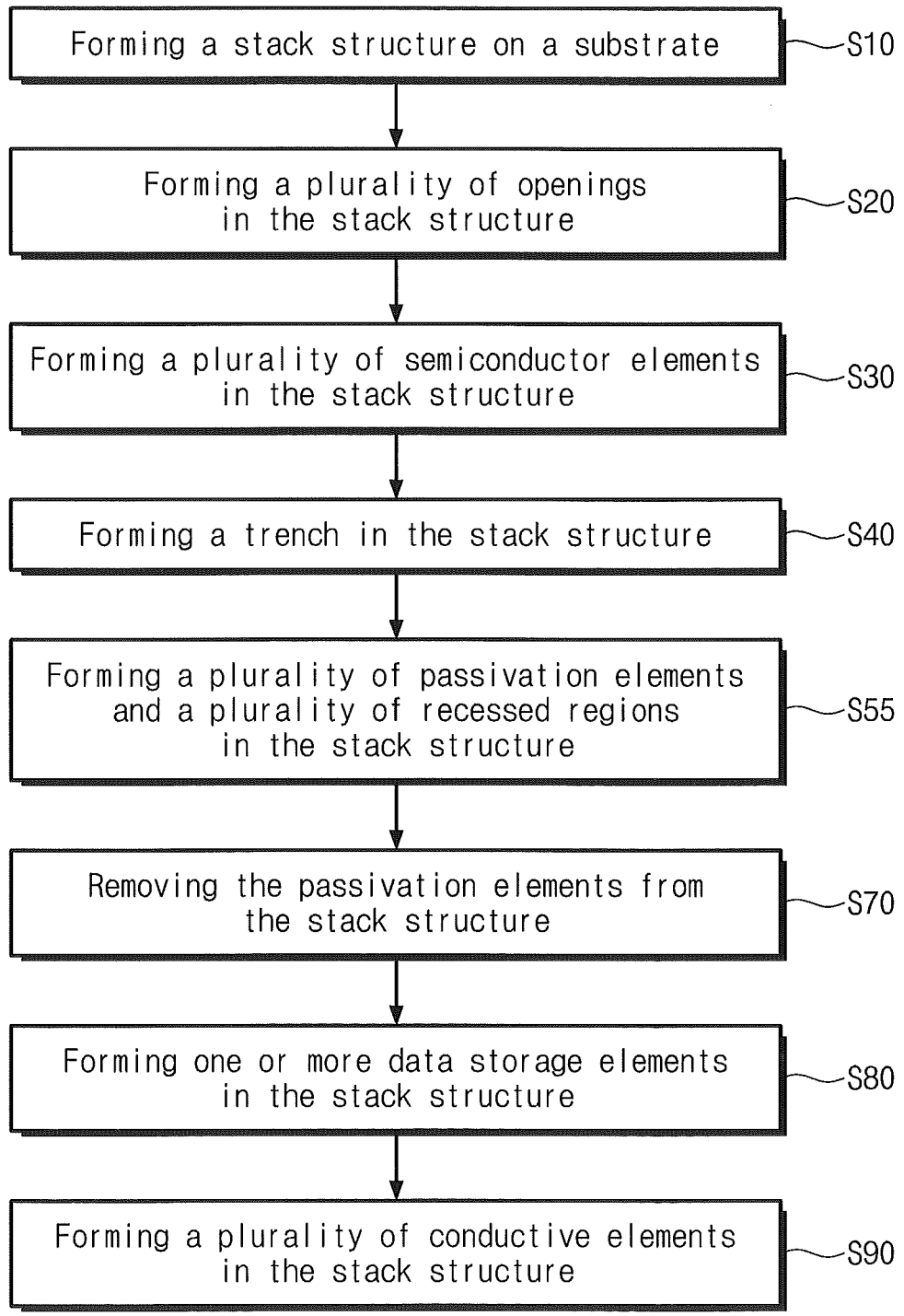
Figure 1D:
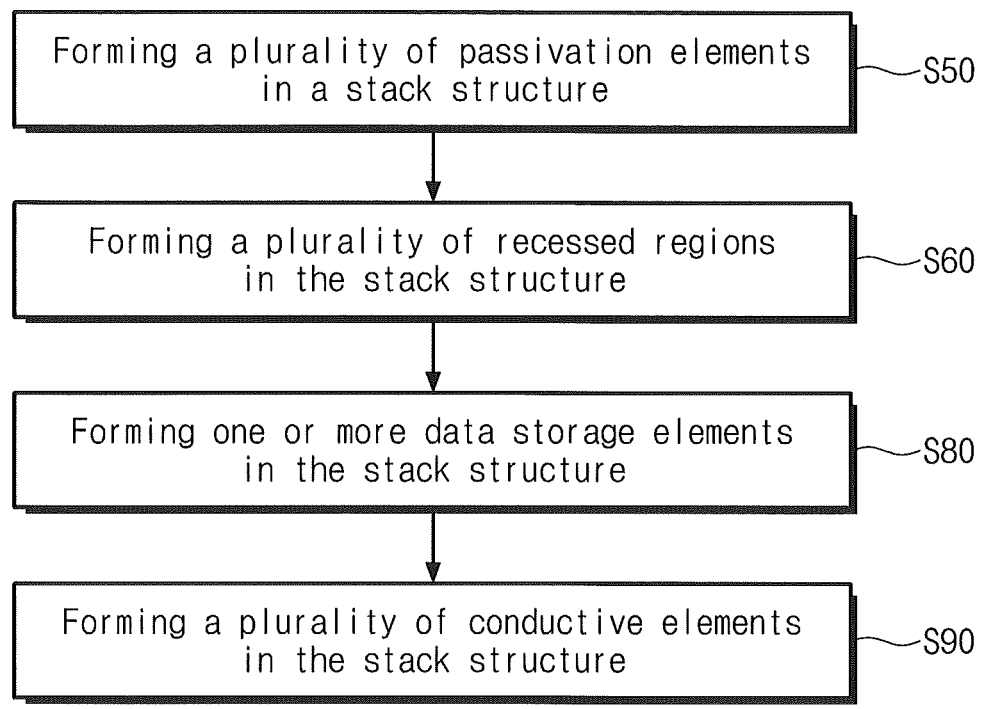
Figure 2:
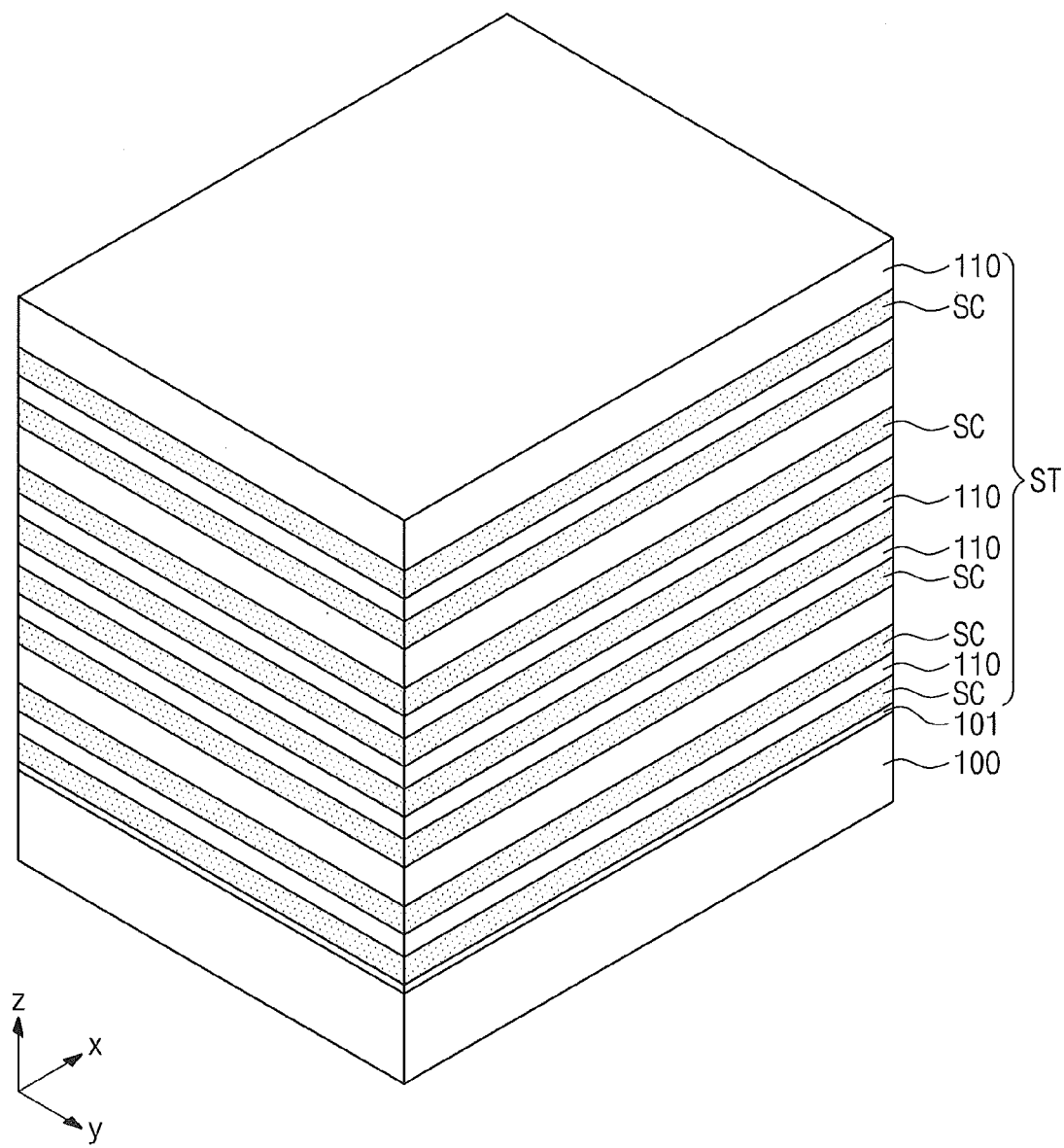
FIGS. 2-8 are perspective views illustrating a method of manufacturing a three-dimensional semiconductor device according to embodiments of the inventive concept.

In some embodiments, the trench and the passivation element(s) are formed concurrently (FIG. 1B). In some embodiments, the passivation element(s) and the recessed region(s) are formed concurrently (FIG. 1C).

Referring to FIGS. 1A-1C and 2, forming a stack structure ST on a substrate S10 may comprise, alternately stacking a plurality of sacrificial layers SC and a plurality of insulation layers 110 on a substrate 100. In some embodiments, a buffer insulation layer 101 may be stacked on the substrate 100 underneath the plurality of sacrificial layers SC and a plurality of insulation layers 110 (e.g., between the substrate 100 and the lowermost sacrificial layer SC).

The sacrificial layers SC and the insulation layers 110 may be stacked on any suitable substrate 100, including, but not limited to, a semiconductor substrate (e.g., a silicon wafer, a silicon layer, a germanium layer or a silicon-germanium layer), an insulation substrate (e.g., an insulation layer, such as an oxide layer, a nitride layer or a glass layer) and a semiconductor layer covered with an insulation layer.

Any suitable buffer insulation layer 101 may be stacked on the substrate, including, but not limited to, a silicon oxide layer (e.g., a silicon oxide layer formed using a thermal oxidation process). In some embodiments, the buffer insulation layer 101 is thinner than one or more of the insulation layers 110.

Any suitable sacrificial layers SC may be, stacked on the substrate, including, but not limited to, silicon layers, silicon oxide layers, silicon carbide layers and/or silicon nitride layers. In some embodiments, one or more of the sacrificial layers SC is a silicon nitride layer.

Any suitable insulation layers 110 may be stacked on the substrate, including, but not limited to, silicon layers, silicon oxide layers, silicon carbide layers and/or silicon nitride layers. In some embodiments, one or more of the insulation layers 110 is a silicon oxide layer (e.g., a high density plasma (HDP) oxide layer, a tetraethylorthosilicate (TEOS) layer, a plasma enhanced tetraethylorthosilicate (PE-TEOS) layer, an ozone tetraethylorthosilicate ($O_3$-TEOS) layer, an undoped silicate glass (USG) layer, a phosphosilicate glass (PSG) layer, a borosilicated glass (BSG) layer, a borophosphosilicate glass (BPSG) layer, a fluorosilicate glass (FSG) layer, a spin on glass (SOG) layer, a tonen silazene (TOSZ) layer or a layer comprising a combination of two or more of the aforementioned types of layers).

In some embodiments, one or more of the sacrificial layers SC is a silicon nitride layer and one or more of the insulation layers 110 is a silicon oxide layer. For example, the sacrificial layers SC may comprise one or more silicon nitride layers, and the insulation layers 110 may comprise one or more silicon nitride layers selected from the group consisting of HDP oxide layers, TEOS layers, PE-TEOS layers, $O_3$-TEOS layers, USG layers, PSG layers, BSG layers, BPSG layers, FSG layers, SOG layers, TOSZ layers and layers comprising a combination of two or more of the aforementioned types of layers.

The sacrificial layers SC may by selectively etched using one or more etching agents. That is, one or more of the sacrificial layers SC may be more susceptible to etching with a given etching agent (e.g., phosphoric acid) than the insulation layers 110. In some embodiments, the etch selectivity between the sacrificial layers SC and the insulation layers 110 is at least about 20, 30, 40, 50, 60, 70, 80, 90, 100, 110, 120, 130, 140, 150 or more. Accordingly, one or more of the sacrificial layers may be selectively etched.

The dimensions of the sacrificial layers SC (e.g., the thickness of the sacrificial layers SC) may define the size of the channels in which one or more data storage elements 150 and/or one or more conductive elements 160 is formed. In some embodiments, the dimensions of the sacrificial layers SC define the size of the channels in which one or more string selection transistors SST (refer to FIGS. 13-14), one or more ground selection transistors GST (refer FIGS. 13-14) and/or one or more memory cell transistors MCT (refer to FIGS. 13-14) are formed.

The dimensions of the insulation layers 110 may be such that data storage elements 150 and/or conductive elements 160 in the channels formed by the removal of adjacent sacrificial layers SC may be connected to each other by a fringe electric field. That is, one or more of the insulation layers 110 may be thin enough that data storage elements 150 and/or conductive elements 160 in the channels formed by removal of the sacrificial layers SC on both sides of the insulation layer(s) 110 may be connected by a fringe electric field when a voltage over a threshold voltage is applied to the data storage elements 150 and/or conductive elements 160. Thus, when the insulation layers 110 are sufficiently thin, a current path may be formed between adjacent channels in the absence of a direct electrical connection between the channels. For example, memory cell transistors MCT formed in adjacent channels may be connected to one another by a fringe electric field (e.g., when a high voltage over a threshold voltage is applied to their gate electrodes), thereby establishing a current path between the memory cell transistors MCT even without formation of source/drain regions of the memory cell transistors MCT.

As shown in FIGS. 1A-1C and 3, a plurality of openings 120 may be formed in a stack structure ST comprising a plurality of sacrificial layers and one or more insulation layers, wherein the sacrificial layer(s) and the insulation layer(s) are alternately stacked such that, if a plurality of insulation layers is included in the stack structure, at least one sacrificial layer is interposed between each insulation layer and the next insulation layer in the stack.

Openings 120 of the inventive concept may be formed in the stack structure ST using any suitable method known in the art, including, but not limited to, forming a mask pattern (not shown) on the stack structure ST to define the planar positions of the openings 120 and anisotropically etching the stack structure ST using the mask pattern as an etch mask Any suitable anisotropic etching agent may be used, including, but not limited to, fluorine-based gases, such as $CF_4$, $CHF_3$, $NF_3$ and $SF_6$. In some embodiments, the anisotropic etching agent comprises one or more fluorine-based gases in combination with oxygen gas, hydrogen gas and/or an inert gas, such as helium or argon.

Figure 3:
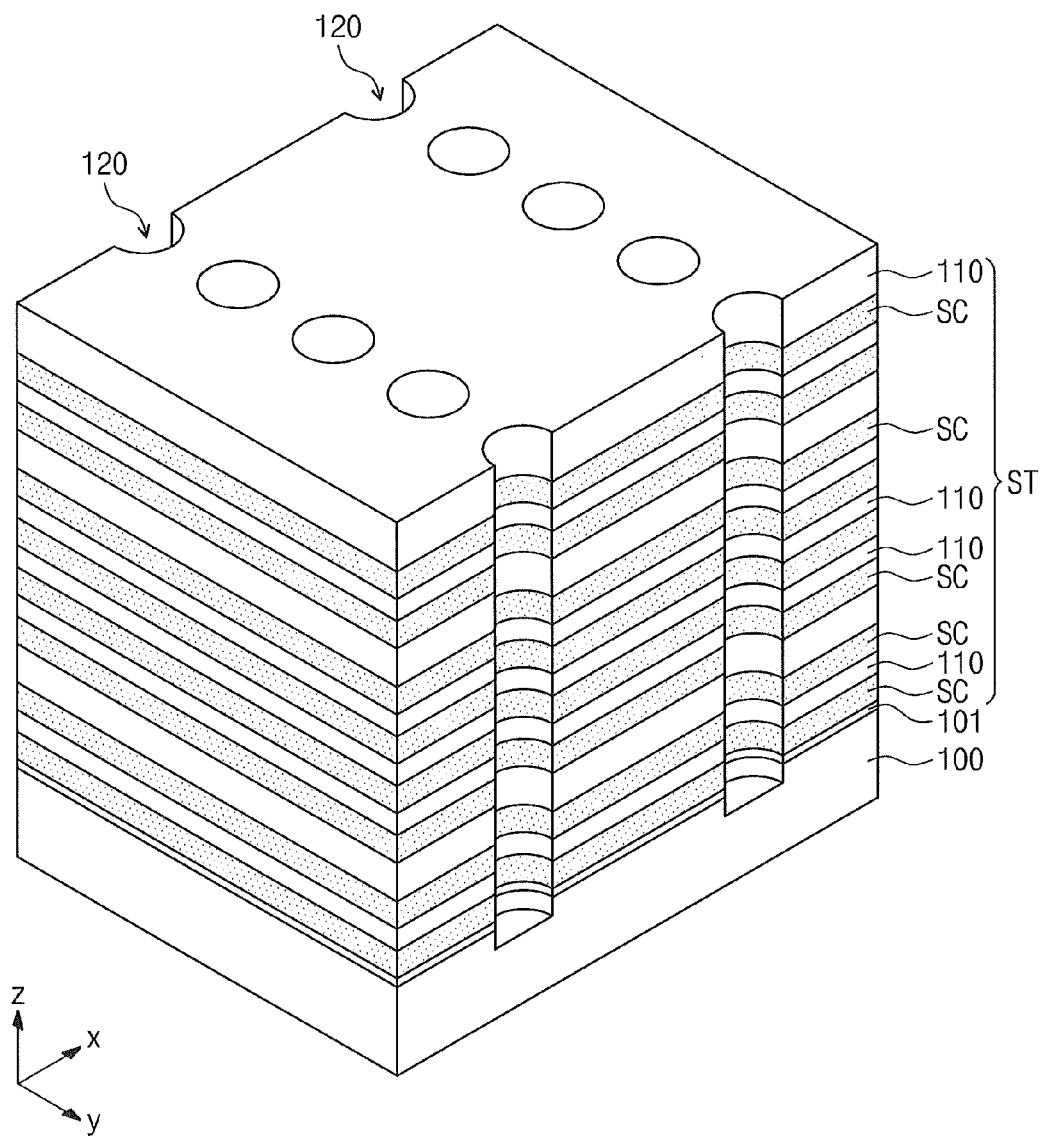

Openings 120 of the inventive concept may be of any suitable depth. In some embodiments, one or more of the openings 120 passes through each sacrificial layer SC, each insulation layer 100 and (if present) the buffer insulation layer 101 and exposes the substrate 100. In some embodiments, one or more of the openings 120 extends into the substrate 100 (i.e., the opening may extend below the uppermost boundary of the substrate 100, forming a recessed region therein, as shown in FIG. 3).

Openings 120 of the inventive concept may be of any suitable dimensions. In some embodiments, one or more of the openings 120 is formed to have a circular shape or a polygonal shape in a plan view. In some embodiments, the width of one or more of the openings 120 varies as a function of the distance from the substrate 100 (e.g., the sidewalls of one or more of the openings 120 may be sloped). Such variations in the width of the openings 120 may be due to the nature of the process used to form the openings 120 (e.g., the anisotropic etching process may give rise to openings 120 with sloped sidewalls).

Figure 10:
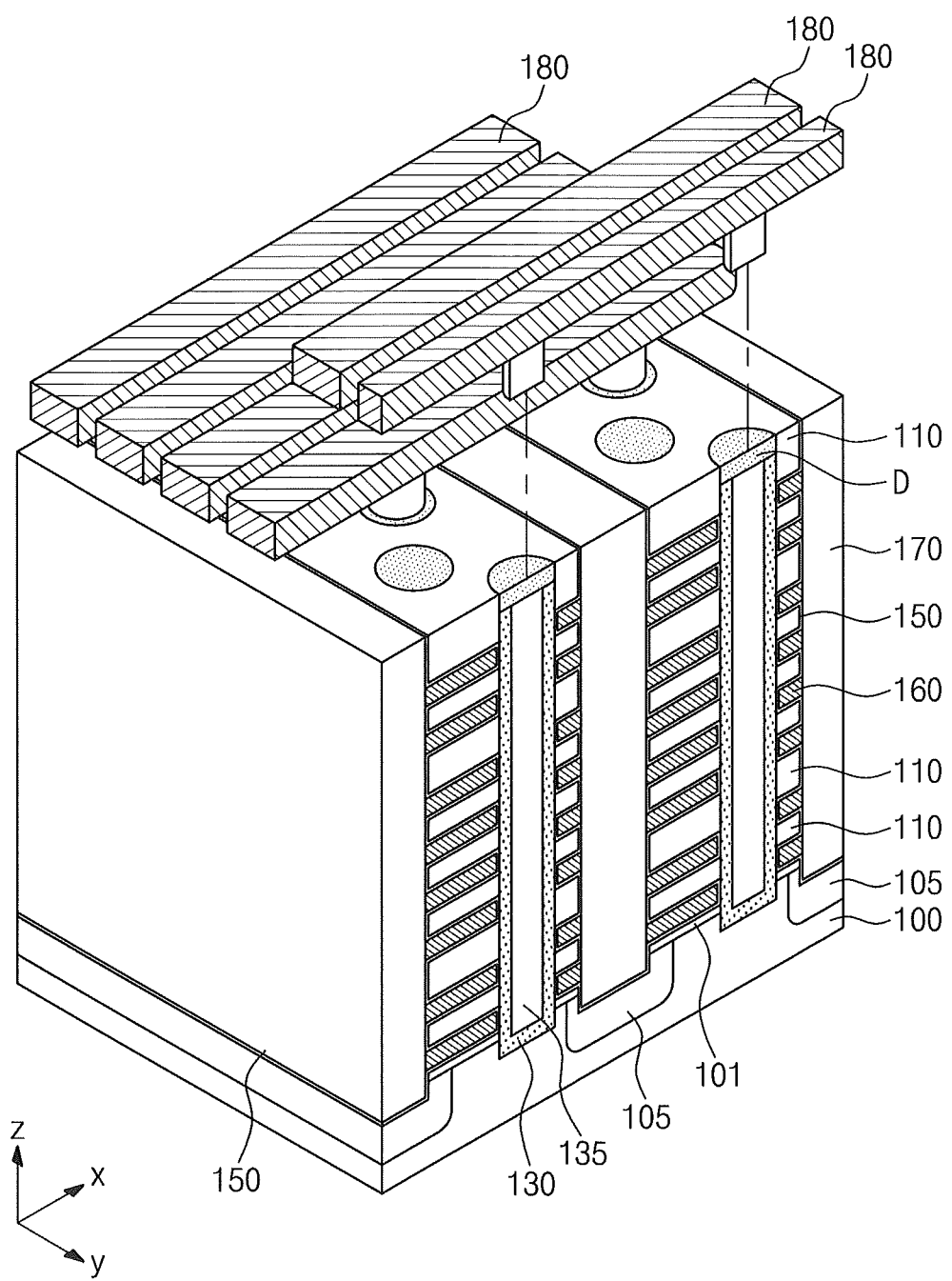

Openings 120 of the inventive concept may be formed in the stack structure ST in any suitable configuration. In some embodiments, the openings 120 are configured in a pattern. For example, the openings 120 may be two dimensionally and regularly arrayed in an x-y plane parallel with the top surface of the substrate 100. Thus, in some embodiments, the openings 120 may be arrayed in columns parallel with an x-axis and in rows parallel with a y-axis in a plan view (as shown in FIG. 3) and/or in rows that zigzag along the y-axis (as shown in FIG. 10). By varying the pattern into which the openings 120 are configured, one may selectively increase the number of openings 120 formed in the stack structure ST without substantially reducing the distance between adjacent openings 120 (e.g., the number of openings 120 per unit length parallel with the y-axis may be greater in a device according to FIG. 10 than in a device according to FIG. 3). In some embodiments, the distance between the openings 120 arrayed in the y-axis direction is equal to or less than the width of one or more of the openings 120. Thus, as will be appreciated by one of skill in the art, the integration density of the openings 120 may be increased by selectively configuring the openings 120 in the stack structure ST.

Figure 4:
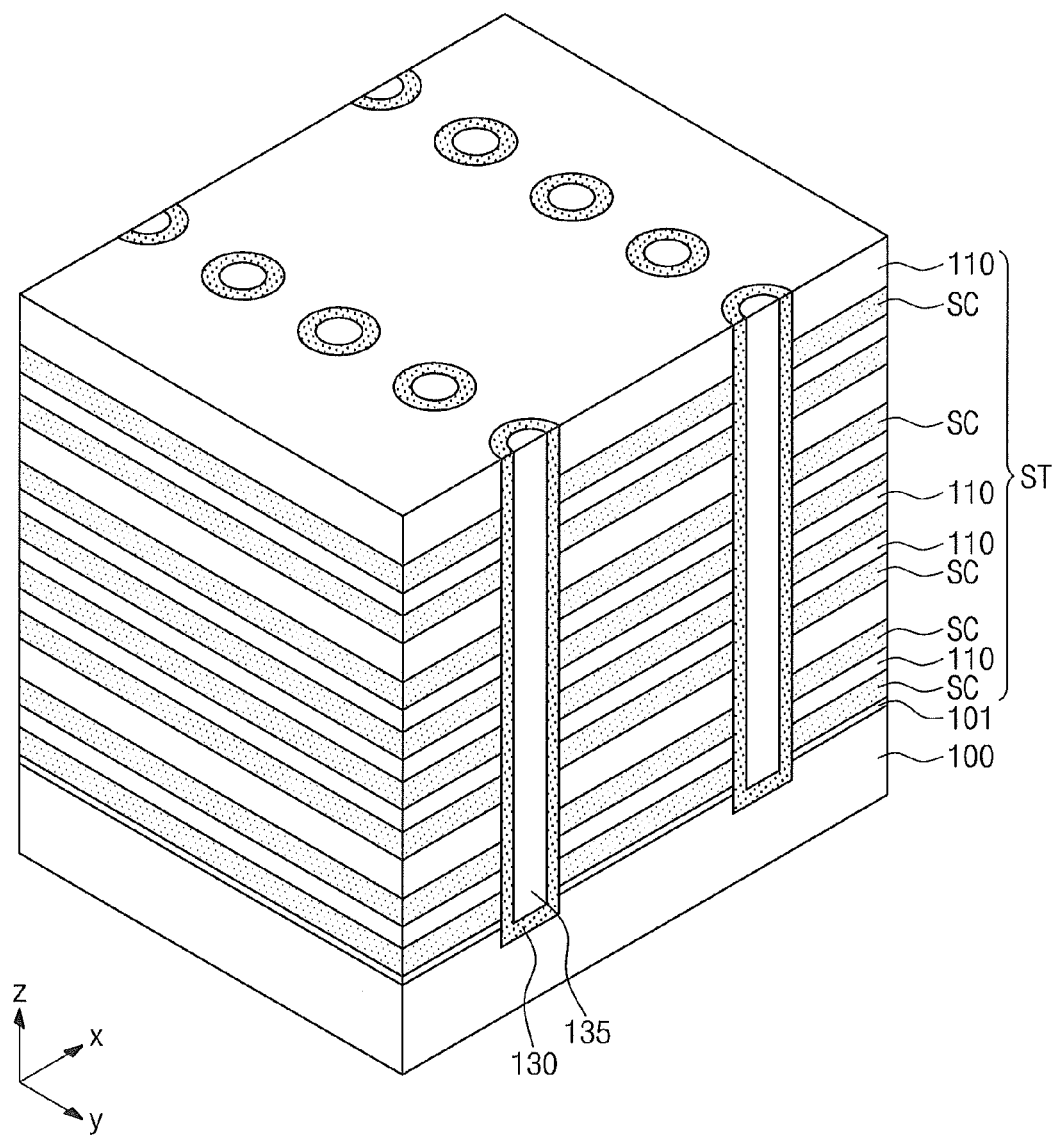

As shown in FIGS. 1A-1C and 4, a plurality of semiconductor elements 130 may be formed in a stack structure ST comprising a plurality of sacrificial layers and one or more insulation layers, wherein the sacrificial layer(s) and the insulation layer(s) are alternately stacked such that, if a plurality of insulation layers is included in the stack structure, at least one sacrificial layer is interposed between each insulation layer and the next insulation layer in the stack. In some embodiments, one or more of the semiconductor elements 130 is formed in an opening 120 and directly contacts the substrate 100. In some embodiments, one of more of the semiconductor elements 130 passes through each sacrificial layer SC, each insulation layer 100 and (if present) the buffer insulation layer 101. In some embodiments, one or more of the semiconductor elements 130 extends into the substrate 100 (i.e., into a recessed region of the substrate 100, as shown in FIG. 4). In some embodiments, one or more of the semiconductor elements 130 is substantially perpendicular to the substrate 100. In some embodiments, a semiconductor element 130 is formed in each opening 120, and each semiconductor element 130 directly contacts the substrate 100.

Semiconductor elements 130 of the inventive concept may comprise any suitable material known in the art. In some embodiments, one or more of the semiconductor elements 130 comprises a silicon layer, a germanium layer and/or a silicon-germanium layer. In some embodiments, one or more of the semiconductor elements 130 comprises a doped semiconductor layer (e.g., an extrinsic semiconductor layer doped with impurities) and/or an undoped semiconductor layer (e.g., an intrinsic semiconductor layer). In some embodiments, one or more of the semiconductor elements 130 has a crystalline structure comprising at least one of an amorphous structure, a polycrystalline structure and a single crystalline structure.

Semiconductor elements 130 of the inventive concept may be formed (e.g., in the openings 120) using any suitable method known in the art, including, but not limited to, deposition processes (e.g., chemical vapor deposition (CVD) processes and atomic layer deposition (ALD) processes) and epitaxial growth processes (e.g., epitaxial growth processes wherein the substrate 100 acts as a seed layer). If a semiconductor element 130 is formed using a deposition process, a discontinuous interface may be formed between the semiconductor element 130 and the substrate 100. In some such embodiments, the discontinuous interface is formed because of one or more differences between the crystallographic structure(s) of the semiconductor element 130 and the crystallographic structure(s) of the substrate 100. In some embodiments, one or more of the semiconductor elements 130 is formed by depositing an amorphous silicon layer and/or a polycrystalline silicon layer into an opening 120, and then crystallizing the silicon layer(s) using a thermal treatment process (e.g., a laser annealing process). In some such embodiments, the resultant semiconductor element 130 has a single crystalline structure.

Semiconductor elements 130 of the inventive concept may be of any suitable dimensions. In some embodiments, a semiconductor element 130 of the inventive concept is formed in an opening 120 and conforms to the contours of that opening 120.

In some embodiments, one or more of the semiconductor elements 130 completely fills the opening 120 in which it is formed. In some such embodiments, the semiconductor element 130 is planarized with the top surface of the stack structure.

In some embodiments, one or more of the semiconductor elements 130 only partially fills the opening 120 in which it is formed. For example, the semiconductor element 130 may comprise a semiconductor layer with a thickness that is less than or equal to about half the width of one or more of the openings 120 and may partially fill the opening 120 such that it has a pipe-shaped configuration, a hollow cylinder-shaped configuration or a cup-shaped configuration. In some embodiments, the semiconductor element 130 comprises a semiconductor layer with a thickness that is less than or equal to about the width of a depletion layer formed in the semiconductor element 130 during operation of the semiconductor device into which the semiconductor element 130 is incorporated. In some embodiments, the semiconductor element 130 comprises a semiconductor layer with a thickness that is less than or equal to about the average length of silicon grains constituting a semiconductor element 130 having a polycrystalline structure.

In some embodiments, one or more of the empty regions in an opening 120 containing a semiconductor element 130 that only partially fills the opening 120 may be at least partially filled with a buried insulation element 135. The buried insulation element(s) 135 may comprise any suitable insulating material, including, but not limited to, a silicon oxide layer (e.g., a high density plasma (HDP) oxide layer, a tetraethylorthosilicate (TEOS) layer, a plasma enhanced tetraethylorthosilicate (PE-TEOS) layer, an ozone tetraethylorthosilicate ($O_3$-TEOS) layer, an undoped silicate glass (USG) layer, a phosphosilicate glass (PSG) layer, a borosilicated glass (BSG) layer, a borophosphosilicate glass (BPSG) layer, a fluorosilicate glass (FSG) layer, a spin on glass (SOG) layer, a tonen silazene (TOSZ) layer or a layer comprising a combination of two or more of the aforementioned types of layers). For example, one or more of the buried insulation elements 135 may comprise an an insulation material having an excellent gap-filling characteristics, such as a HDP oxide layer, an SOG layer and/or a CVD oxide layer.

Figure 9:
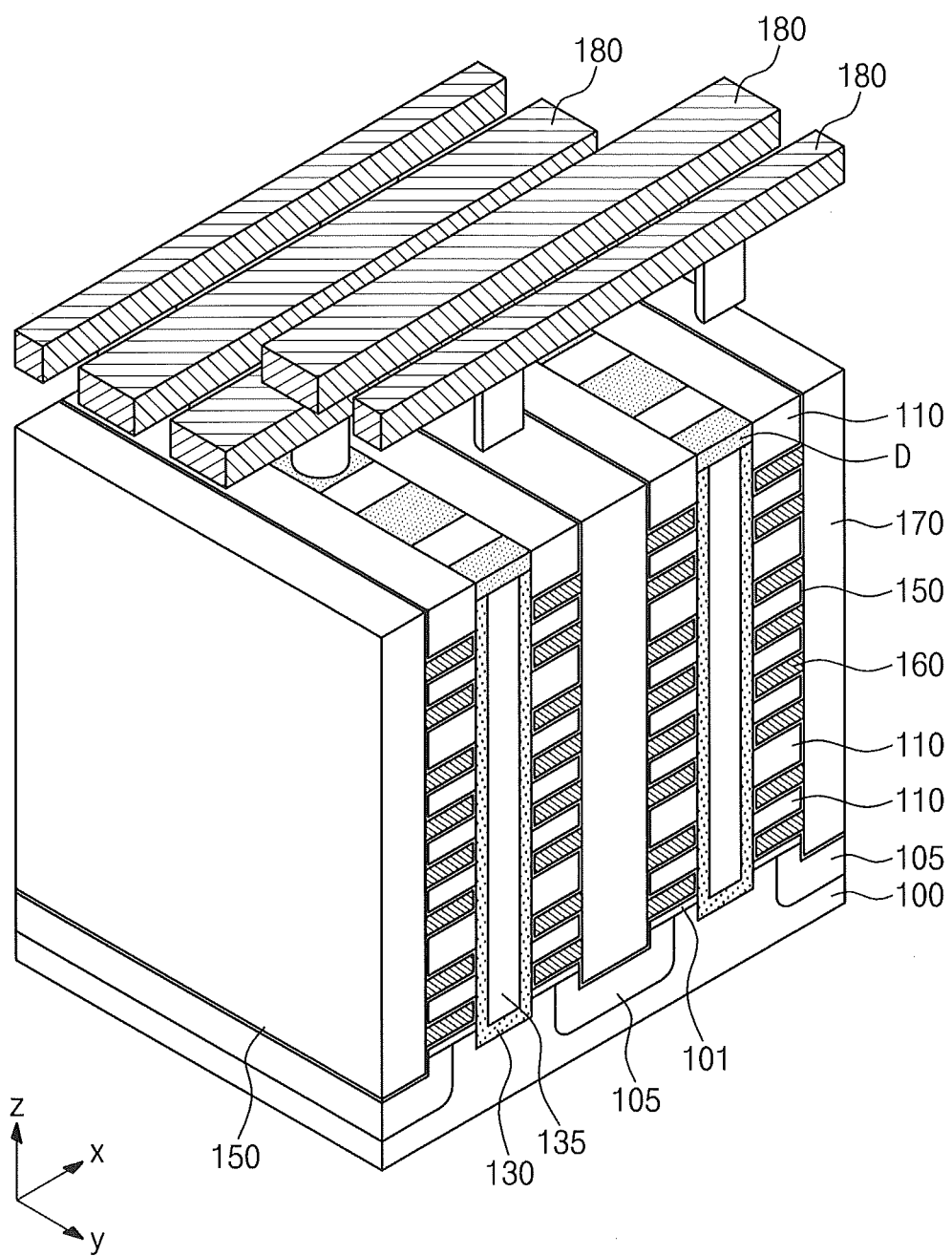
FIGS. 9-10 are perspective views illustrating three-dimensional semiconductor devices according to embodiments of the inventive concept.

In the event that the openings 120 are formed to have line shapes (e.g., groove shapes, as illustrated in FIG. 9), a plurality of semiconductor elements 130 may be formed in each of the groove-shaped openings 120 and the plurality of semiconductor elements 130 in each of the groove-shaped openings 120 may be separated from each other by buried insulation patterns 135. The semiconductor elements 130 illustrated in FIG. 9 may be formed by alternately forming a semiconductor element 130 and a buried insulation element 135 in the groove-shaped openings 120. For example, a plurality of semiconductor elements 130 may be formed in each of the groove-shaped openings 120 by 1) forming a first semiconductor element 130 in the opening 120, 2) forming a buried insulation element 135, 3) forming a second semiconductor element 130 in the opening 120. The semiconductor elements 130 and/or the buried insulation elements 135 may be planarized. Thus, each of the semiconductor elements 130 may have a rectangular shape in a plan view parallel with the x-y plane. Further, each of the semiconductor elements 130 may be formed to have a 'U'-shaped configuration in a vertical cross sectional view parallel with an x-z plane.

As shown in FIGS. 1A-1C and 5, one or more trenches 140 may be formed in a stack structure ST comprising a plurality of sacrificial layers and one or more insulation layers, wherein the sacrificial layer(s) and the insulation layer(s) are alternately stacked such that, if a plurality of insulation layers is included in the stack structure, at least one sacrificial layer is interposed between each insulation layer and the next insulation layer in the stack (e.g., after formation of one or more semiconductor elements 130 and/or the buried insulation elements 135 therein). Formation of the trench(es) may create at least one exposed surface in one or more of the sacrificial layers SC in the stack structure ST and/or at least one exposed surface in one or more of the insulations layers 110 in the stack structure ST. For example, an exposed sidewall that borders the trench 140 may be formed in each of the sacrificial layers SC and insulations layers 110 concurrently with formation of the trench 140.

Trenches 140 of the inventive concept may be formed in the stack structure ST using any suitable method known in the art, including, but not limited to, forming a mask pattern (not shown) on the stack structure ST to define the planar positions of the trenches 140 and anisotropically etching the stack structure ST using the mask pattern as an etch mask. Any suitable anisotropic etching agent may be used, including, but not limited to, fluorine-based gases, such as $CF_4$, $CHF_3$, $NF_3$ and $SF_6$. In some embodiments, the anisotropic etching agent comprises one or more fluorine-based gases in combination with oxygen gas, hydrogen gas and/or an inert gas, such as helium or argon.

Figure 5:
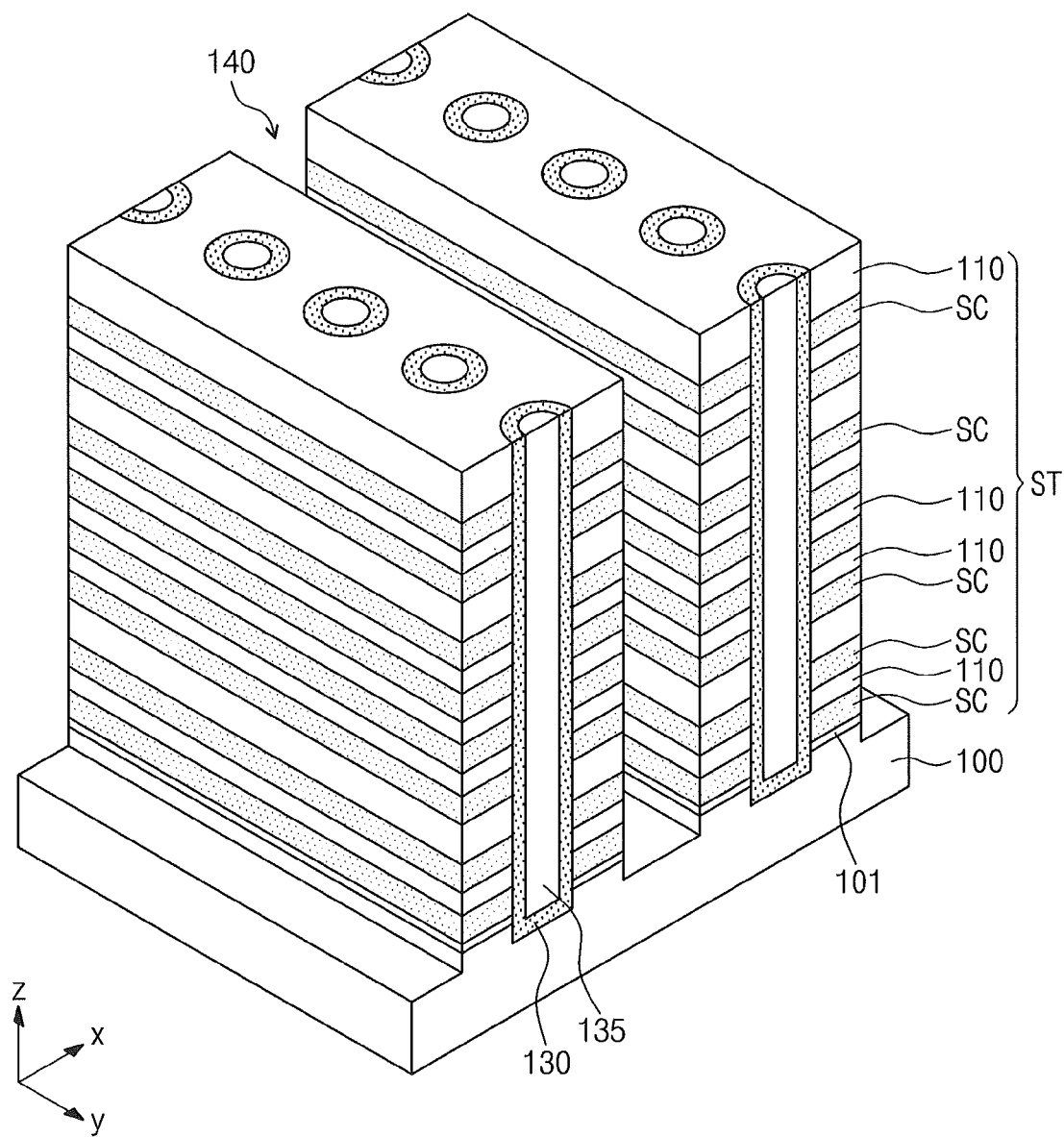

Trenches 140 of the inventive concept may be of any suitable depth. In some embodiments, one or more trenches 140 passes through each sacrificial layer SC, each insulation layer 100 and (if present) the buffer insulation layer 101 and exposes the substrate 100. In some embodiments, one or more trenches 140 extends into the substrate 100 (i.e., the opening may extend below the uppermost boundary of the substrate 100, forming a recessed region therein, as shown in FIG. 5).

Trenches 140 of the inventive concept may be of any suitable dimensions. In some embodiments, one or more of the trenches 140 is formed to have a line shape or a rectangular shape in a plan view. In some embodiments, the width of one or more trenches 140 varies as function of the distance from substrate 100 (e.g., the sidewalls of one or more of the trenches 140 may be sloped). Such variations in the width of the trench(es) 140 may be due to the nature of the process(es) used to form the trench(es) 140 (e.g., the anisotropic etching process may give rise to a trench 140 with sloped sidewalls).

Trenches 140 of the inventive concept may be formed in the stack structure ST in any suitable configuration. In some embodiments, the trench(es) 140 are configured such that it/they run parallel (or substantially parallel) with the y-axis of the substrate and/or with one or more rows of semiconductor elements 130. The trench(es) 140 may be spaced apart from the semiconductor elements 130 by any suitable distance.

Formation of the trench(es) 140 may divide the stack structure ST into a plurality of small stacked structures SST (e.g., rectangular stacked structures whose long axes are parallel (or substantially parallel) with the y-axis of the substrate). The semiconductor elements 130 arrayed in a single row parallel with the y-axis may penetrate one of the small stacked structures SST. Each of the small stacked structures SST may comprise inner sidewalls adjacent to the semiconductor elements 130 and exposed outer sidewalls bordering a trench 140. Each of the small stacked structures SST may comprise a plurality of sacrificial layers SC and a plurality of insulation layers 110 that are alternately and repeatedly stacked.

In some embodiments, one or more passivation elements 115 is formed in the stack structure ST concurrently with or following the formation of said trench(es) 140 (as shown in FIG. 1B). The process of forming one or more passivation elements 115 in the stack structure ST will be described in more detail with reference to FIGS. 11A-11E below.

As shown in FIGS. 1A-1D, a plurality passivation elements 115 may be formed in a stack structure ST comprising a plurality of sacrificial layers and one or more insulation layers, wherein the sacrificial layer(s) and the insulation layer(s) are alternately stacked such that, if a plurality of insulation layers is included in the stack structure, at least one sacrificial layer is interposed between each insulation layer and the next insulation layer in the stack. The process of forming one or more passivation elements 115 in the stack structure ST will be described in more detail with reference to FIGS. 11A-11E below.

As shown in FIGS. 1A-1D and 6, one or more recessed regions 142 may be formed in a stack structure ST comprising a plurality of sacrificial layers and one or more insulation layers, wherein the sacrificial layer(s) and the insulation layer(s) are alternately stacked such that, if a plurality of insulation layers is included in the stack structure, at least one sacrificial layer is interposed between each insulation layer and the next insulation layer in the stack. Each recessed region 142 may be formed by removing at least a portion of one or more sacrificial layers SC. In some embodiments, each recessed region 142 is formed by completely removing one or more sacrificial layers SC. Thus, one or more of the recessed regions 142 may be formed such that it extends to and exposes at least a portion of one or more semiconductor elements 130.

Recessed regions 142 of the inventive concept may be formed in the stack structure ST using any suitable method known in the art, including, but not limited to, isotropically etching the sacrificial layers SC (e.g., using an etching agent that exhibits an etch selectivity with respect to one or more of the insulation layers 110). In some embodiments, one or more of the sacrificial layers SC is completely removed by an isotropic etching process. For example, when the sacrificial layers SC are formed of a silicon nitride layer and the insulation layers 110 are formed of a silicon oxide layer, an isotropic etching process may be performed using an etchant agent comprising phosphoric acid.

Recessed regions 142 of the inventive concept may be of any suitable dimensions. In some embodiments, the thickness of each recessed region is defined by a pair of insulation layers 110 or by the buffer insulation layer 101 and the lowermost insulation layer 110. Thus, the vertical thickness (i.e., width in the z-axis) of each recessed region 142 may be determined by the thickness of the sacrificial layer(s) that were removed to form said recessed region 142.

In some embodiments, one or more passivation elements 115 is formed in the stack structure ST prior to or concurrently with the formation of said recessed region(s) 142. The process of forming one or more passivation elements 115 in the stack structure ST will be described in more detail with reference to FIGS. 11A-11E below.

As shown in FIGS. 1A-1C, at least a portion of one or more passivation elements 115 may be removed the stack structure ST.

Passivation elements 115 of the inventive concept may be removed using any suitable method known in the art, including, but not limited to, annealing processes, ultra-violet treatment processes and ozone treatment processes.

As shown in FIGS. 1A-1D and 7, one or more data storage elements 150 may be formed in a stack structure ST comprising a plurality of sacrificial layers and one or more insulation layers, wherein the sacrificial layer(s) and the insulation layer(s) are alternately stacked such that, if a plurality of insulation layers is included in the stack structure, at least one sacrificial layer is interposed between each insulation layer and the next insulation layer in the stack. Each data storage element 150 may be formed in one or more recessed regions 142. In some embodiments, each data storage element 150 is formed such that it at least partially fills at least two recessed regions 142. In some embodiments, each data storage layer 150 conformally covers at least one small stacked structure SST, including any recessed regions 142 formed therein. Thus, each data storage element 150 may be formed such that it contacts at least a portion of one or more semiconductor elements 130.

Data storage element 150 of the inventive concept may be formed in the stack structure ST using any suitable method known in the art, including, but not limited to, deposition processes (e.g., CVD processes and ALD processes capable of providing excellent step coverage).

Data storage elements 150 of the inventive concept may be of any suitable dimensions. In some embodiments, one or more of the data storage elements 150 has a thickness that is less than half the vertical thickness of one or more of the recessed regions 142 in the stack structure ST (e.g., less than half the thickness of one or more of the recessed regions 142 in which the data storage element 150 is formed). In some embodiments, one or more of the data storage elements 150 contacts at least a portion of the layers defining the recessed region 142 in which it is formed (e.g., the top surface of the lowermost insulation layer 110 that defines the recessed region 142 and the bottom surface of the uppermost insulation layer 110 that defines the recessed region 142). In some embodiments, one or more of the data storage elements 150 contacts at least a portion of the substrate 100 (e.g., a portion of the substrate 100 that was exposed by the formation of a trench 140. In some embodiments, one or more of the data storage elements 150 contacts at least a portion of the top surface of the uppermost insulation layer 110 in the stack structure ST. In some embodiments, one or more of the data storage elements 150 contacts at least a portion of the buffer insulation layer 101 (e.g., a portion of the buffer insulation layer 101 that was exposed by the formation of a trench 140 or recessed region 142).

Also as shown in FIGS. 1A-1D and 7, one or more conductive elements 160 may be formed in a stack structure ST comprising a plurality of sacrificial layers and one or more insulation layers, wherein the sacrificial layer(s) and the insulation layer(s) are alternately stacked such that, if a plurality of insulation layers is included in the stack structure, at least one sacrificial layer is interposed between each insulation layer and the next insulation layer in the stack. Each conductive element 160 may be formed in one or more recessed regions 142 (e.g., in a recessed region 142, surrounded by a data storage layer 150 that was previously formed in that same recessed region 142). In some embodiments, each conductive element 160 substantially or completely fills the unfilled portion of a recessed region 142 (e.g., the portion of the recessed region 142 that is not filled by a data storage element 150). In some embodiments, conductive elements 160 are formed in respective ones of the recessed regions 142 and are used as electrodes to which electrical signals for changing data stored in the data storage element(s) 150 are applied.

Conductive elements 160 of the inventive concept may comprise any suitable material known in the art. In some embodiments, one or more of the conductive elements 160 comprises a doped polysilicon layer, a tungsten layer, a metal nitride layer and/or a metal silicide layer.

Conductive elements 160 of the inventive concept may be formed using any suitable method known in the art, including, but not limited to, deposition processes (e.g., CVD processes and ALD processes capable of providing excellent step coverage). In some embodiments, one or more of the conductive elements 160 is formed by sequentially stacking a barrier metal layer 161 (e.g., a metal nitride layer) and a metal layer 163 (e.g., a tungsten layer) as illustrated in FIGS. 12A-12F). In some embodiments, forming a conductive element 160 comprises forming a conductive element 160 in one or more recessed regions 142 and one or more trenches 140 and then at least partially removing that portion of the conductive element 160 that resides in the trench(es) 140 (e.g., by isotropically and/or anisotropically etching that portion of the conductive element 160 that resides in the trench(es) 140). Thus, the conductive patterns 160 in adjacent recessed regions 142 may be separated from one another and/or the conductive patterns 160 in adjacent small stacked structures SST may be separated from one another.

Conductive elements 160 of the inventive concept may be of any suitable dimensions. In some embodiments, one or more of the conductive elements 160 has a thickness that is greater than or equal to about half the vertical thickness of one or more of the recessed regions 142 in the stack structure ST (e.g., greater than or equal to about half the thickness of the recessed region 142 in which the conductive element 160 is formed).

Conductive elements 160 of the inventive concept are not limited to flash memory devices. They may be formed to have various materials and structures different from the above descriptions.

Figure 8:
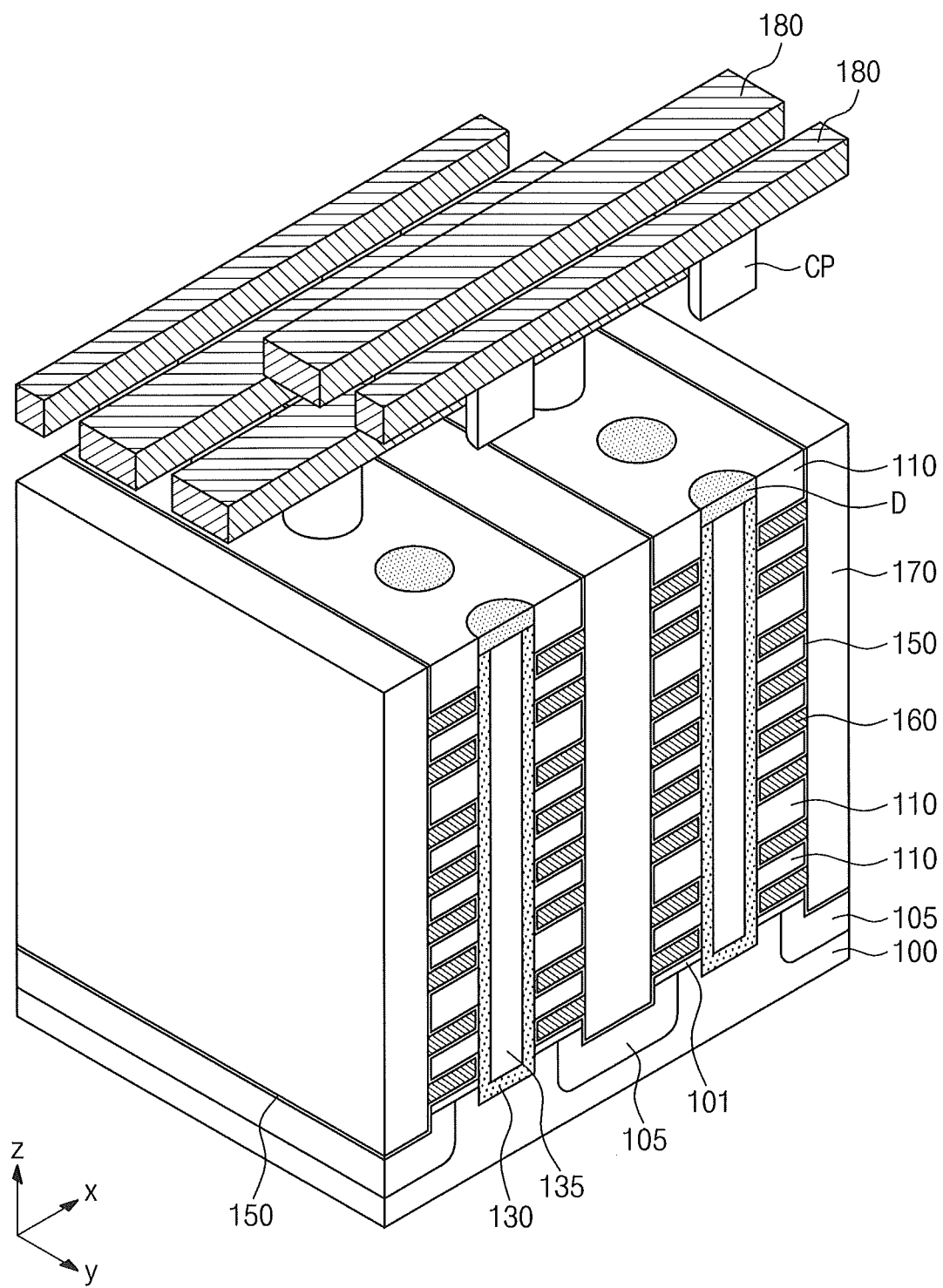

As shown in FIG. 8, one or more impurity regions 105 may be formed in the substrate 100. Each impurity region 105 may be formed to have a conductivity type different from the substrate 100. Thus, PN junctions may be formed between the impurity region(s) 105 and the substrate 100.

Impurity regions 105 of the inventive concept may be formed using any suitable method known in the art, including, but not limited to, ion implantation processes. In some embodiments, one or more of the impurity regions is formed in a portion of the substrate 100 that is exposed by a trench 140. In some embodiments, one or more of the impurity regions is formed after formation of the conductive element(s) 160. In some embodiments, one or more of the impurity regions is formed prior to formation of the conductive element(s) 160.

In those embodiments comprising a plurality of impurity regions 105, any suitable configuration of electrical connectivity between the impurity regions may be utilized. For example, two or more impurity regions 105 may be electrically connected to one another such that they have the same electric potential and/or one or more of the impurity regions 105 may be electrically disconnected from every other impurity region 105 in the stack structure ST such that an electrical signal can be independently applied to each disconnected impurity region 105.

Also as shown in FIG. 8, one or more electrode separation elements 170 may be formed in the stack structure ST. Each electrode separation element may be form in a trench 140.

Electrode separation elements 170 of the inventive concept may comprise any suitable material known in the art. In some embodiments, one or more of the electrode separation elements 170 comprises a silicon oxide layer, a silicon nitride layer and/or a silicon oxynitride layer. In some embodiments, one or more of the upper interconnection lines 180 comprises a doped silicon layer or a metallic material.

Also as shown in FIG. 8, one or more upper interconnection lines 180 may be formed to cross over the electrode separation pattern 170. Each upper interconnection line 180 may be electrically connected to one or more semiconductor elements 130 (e.g., through one or more contact plugs CP). Upper interconnection lines 180 of the inventive concept may be used as the bit lines BL illustrated in FIGS. 13 and 14.

Upper interconnection lines 180 of the inventive concept may comprise any suitable material known in the art. In some embodiments, one or more of the upper interconnection lines 180 comprises a doped silicon layer and/or a metallic material.

As noted above, one or more passivation elements 115 may be formed in the stack structure ST concurrently with the formation of one or more trenches 140, after the formation of one or more trenches 140, prior to the formation of one or more recessed regions 142 and/or concurrently with the formation of one or more recessed regions 142. Thus, in some embodiments, the formation of one or more passivation elements 115 may commence concurrently with the formation of one or more trenches 140 and may end currently with the formation of one or more recessed regions 142.

As discused above with respect to FIGS. 1A-1C and 5-6, recessed regions 142 may be formed in the stack structure ST by etching one or more sacrificial layers SC with an etchant exhibiting an etch selectivity with respect to the insulation layers 110. In some embodiments, one or more of the sacrificial layers SC comprises a silicon nitride layer, and at least a portion of the sacrificial layer(s) SC is selectively removed using a wet etching process that employs a phosphoric acid ($H_3PO_4$) solution as an etchant. As will be understood by one skilled in the art, such wet etching process may generate a byproduct that may be adsorbed on the exposed surface(s) of one or more insulation layers 110 (e.g., one or more surfaces that were exposed by formation of a trench 140 or by the wet etching process itself). Thus, after the wet etching process is performed, the vertical thickness of the insulation layer(s) 110 may be changed by of the presence of the byproduct adsorbed to the surface(s) thereof. Because insulation layer 110 surfaces that are closer to a trench 140 will be exposed to the etchant prior to the exposure of insulation layer 110 surfaces that are farther from the trench, insulation layer 110 surfaces that are closer to the trench 140 may be susceptible to higher levels of byproduct adsorption than insulation layer 110 surfaces that are farther from the trench. Accordingly, the vertical thickness (i.e., width in the z-axis) of insulation layer 110 surfaces that are closer to the trench 140 may be changed to a greater degree than the vertical thickness of insulation layer 110 surfaces that are farther from the trench 140. Thus, the vertical thickness of the insulation layer may decrease as a function of distance away from the trench. In such a case, it may be difficult to completely fill the recessed regions 142 with conductive elements 160 without any voids. Thus, it may be advantageous to prevent the thickness of the insulation layers 110 from being changed and/or to prevent the insulation layers 110 from being damaged while the sacrificial layers SC are selectively removed.

As shown in FIGS. 11A-11D, passivation elements 115 of the inventive concept may be selectively formed on one or more exposed insulation layer 110 surfaces (e.g., one or more surfaces that was exposed during the formation of a trench 140 and/or one or more surface that was exposed during the formation of a recessed region 142). Passivation elements 115 of the inventive concept may prevent one or more surfaces of the insulation layer 110 from being exposed to one or more etching agents and/or may enhance the etch selectivity between the sacrificial layers SC and the insulation layers 110. Thus, the passivation element 115 may prevent the vertical thickness variation of the insulation layers 110 while the recessed regions 142 are formed.

Passivation elements 115 of the inventive concept may be formed using any suitable method known in the art, including, but not limited to, introducing a silicon- and/or hydrocarbon-containing passivation agent into a trench 140 and/or recessed region 142 prior to and/or concurrently with formation of one or more recessed regions 142. In some embodiments, a silicon- and/or hydrocarbon-containing passivation agent is introduced as part of a composition used to form one or more trenches 140 in the stack structure ST (e.g., a trench-forming composition comprising an anisotropic etching agent). In some embodiments, a silicon- and/or hydrocarbon-containing passivation agent is introduced as part of a composition used to form one or more recessed regions 142 in the stack structure ST (e.g., a recess-forming composition comprising phosphoric acid).

Figure 11A:
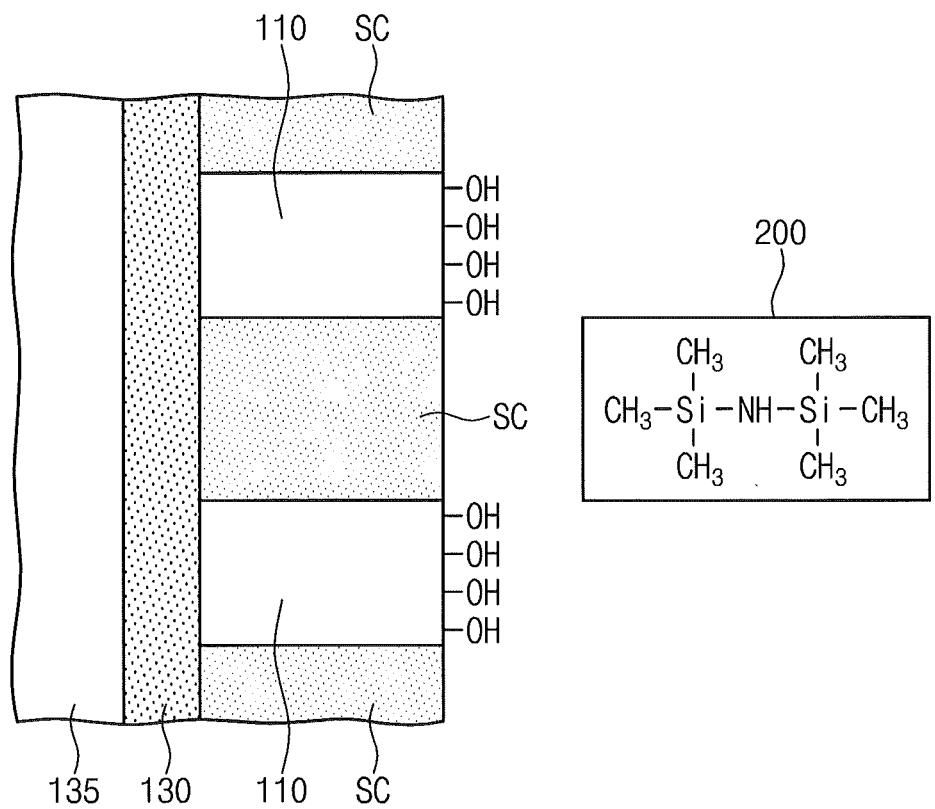
FIGS. 11A-11E are partial cross-sectional views of a three-dimensional semiconductor device illustrating the formation of passivation elements and the removal of sacrificial layers according to embodiments of the inventive concept.

For example, as illustrated in FIG. 11A, the insulation layers 110 may have one or more hydroxyl (—OH) groups at the surfaces thereof after formation of the trench 140. In some embodiments, one or more of the insulation layers 110 comprises a silicon oxide layer wherein one or more hydroxyl groups (—OH groups) is combined with silicon atoms in the insulation layers 110 to generate one or more silanol (Si—OH) groups. In addition, the silanol groups may combine with hydrogen atoms to generate water molecules. Thus, one or more silanol groups and/or one or more water molecules may exist on the surface of the insulation layers 110.

A passivation element 115 of the invention concept may be formed to prevent an insulation layer 110 having a hydrophilic surface from being directly exposed to the etching process for removing the insulation layers 110. That is, the passivation element 115 may be formed to provide the insulation layer with a hydrophobic surface. In more detail, forming the passivation element 115 may include performing a silylation process that reacts the hydroxyl groups of the insulation layer 110 with a silicon-containing passivation agent 200 (e.g., a silylating agent). The silicon-containing passivation agent 200 may be an organic silicon-containing compound. For example, the silicon-containing passivation agent 200 may be a compound containing one or more hydrocarbons ($C_xH_y$), wherein "x" and "y" may be integers which are equal to or greater than 1.

Any suitable silicon-containing passivation agent 200 may be used, including, but not limited to, hexa-methyl-di-silazane (HMDS), tri-methyl-silyl-di-methyl-amine (TMS-DMA), tri-methyl-silyl-di-ethyl-amine (TMSDEA), tetra-methyl-di-silazane (TMDS) and di-methyl-silyl-ethyl-amine (DMSEA).

While the silylation process is performed, the silicon atoms of the silicon-containing passivation agent 200 may react with one or more of the hydroxyl groups on the surface of the insulation layer 110 to generate one or more Si—O bonds. Thus, the passivation element 115 formed on the insulation layer 110 may have a hydrophobic surface.

Figure 11B:
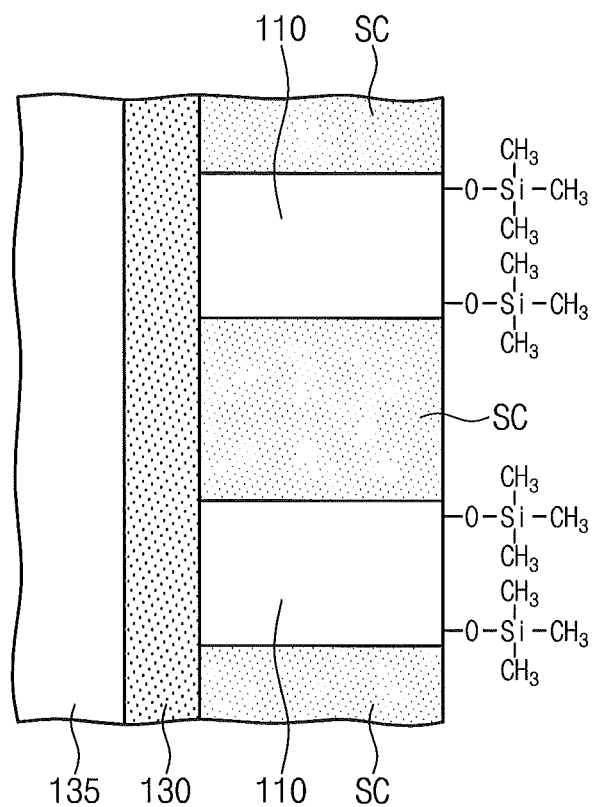
Figure 11C:
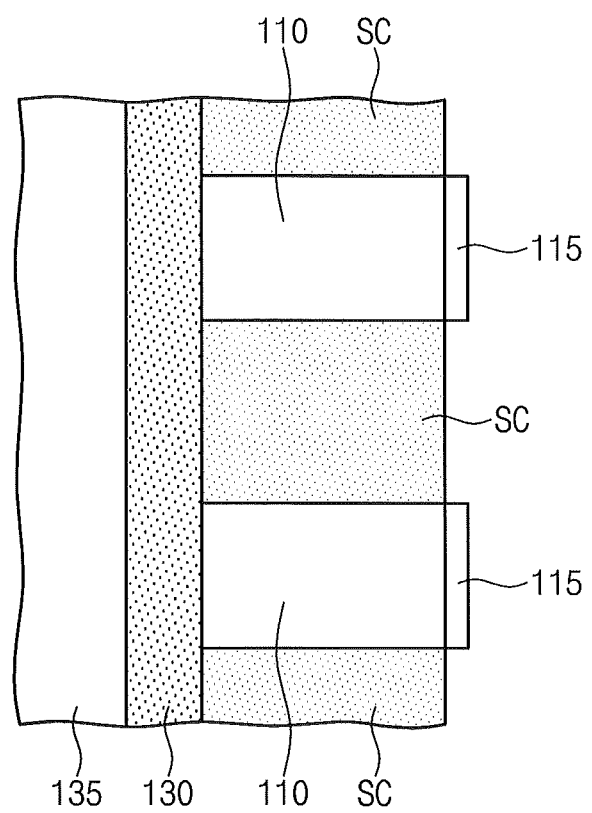

In some embodiments, the silicon-containing passivation agent 200 comprises HMDS, as illustrated in FIG. 11A. In this case, as illustrated in FIGS. 11B and 11C, the passivation element 115 may be formed to have Si—$CH_3$ bonds exhibiting a hydrophobic property by the Chemical Formula 1:

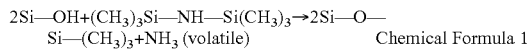

2Si—OH+$(CH_3)_3$Si—NH—Si$(CH_3)_3$→2Si—O—Si—$(CH_3)_3$+$NH_3$ (volatile)   Chemical Formula 1

In some embodiments, forming a passivation element 115 may comprise an annealing process using a dehydrogenation gas as an ambient gas. The annealing process may be a plasma treatment process, a ultra-violet treatment process or a thermal treatment process. The dehydrogenation gas may include a nitrogen gas, an oxygen gas, an ozone gas, a nitrous oxide ($N_2O$) gas or a combination thereof. Alternatively, the dehydrogenation gas may include a carbon gas, a gas containing a halogen group element, a hydrogen gas, an inert gas, or a combination thereof. The dehydrogenation process may reduce the number of the Si—OH bonds in the insulation layers 110 (e.g., silicon oxide layers). Thus, the insulation layers 110 may have a hydrophobic surface after the dehydrogenation process.

In some embodiments, forming a passivation element 115 may comprise a dry cleaning process. For example, the passivation element 115 may be formed by supplying a compound material containing hydrocarbon (CxHy) in a gaseous form, for example, a methane ($CH_4$) gas. In the chemical formula of the hydrocarbon (CxHy), wherein "x" and "y" may be integers which are equal to or greater than 1. Accordingly, the passivation element 115 may be formed to have Si—$CH_3$ bonds exhibiting a hydrophobic property.

Figure 11D:
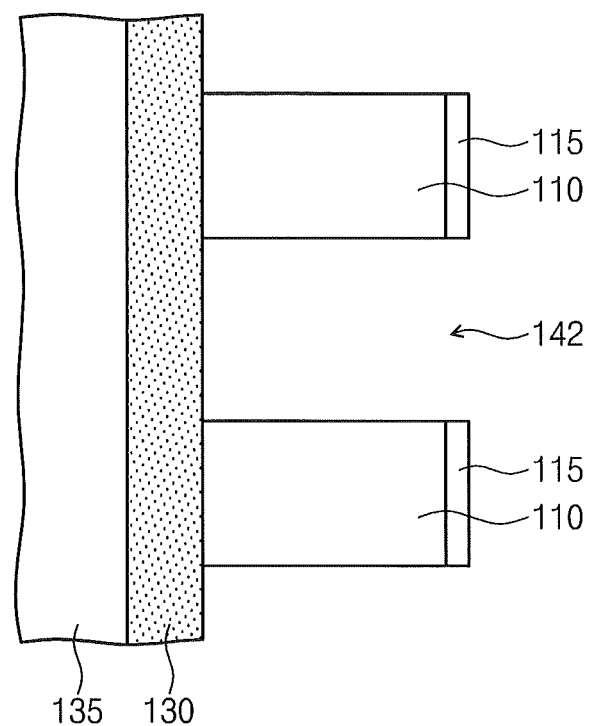

After passivation elements 115 are formed on the exposed outer sidewalls of the insulation layers 110, the sacrificial layers SC may be removed to form the recessed regions 142 as illustrated in FIG. 11D. While the sacrificial layers SC are removed using an etchant, the passivation elements 115 may protect the exposed outer sidewalls of the insulation layers 110 from the etchant.

Figure 11E:
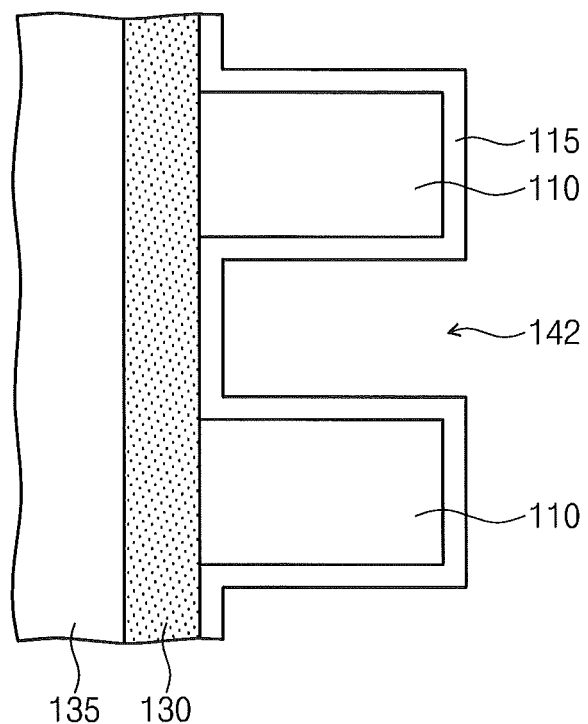

As shown in FIGS. 1C and 11E, one or more passivation elements 115 may be formed in the stack structure ST concurrently with the formation of one or more recessed regions 142. In some embodiments, one or more passivation elements 115 is formed concurrently with the formation of one or more recessed regions 142 using a composition comprising an etchant for selectively removing the sacrificial layers SC and a silicon-containing passivation agent 200. Thus, the surface(s) of the insulation layers 110 exposed by formation of the trench 140 may react with the silicon-containing passivation agent 200 in the mixture to form a passivation element 115 on the outer sidewalls of the insulation layers 110. Further, as the etchant in the mixture removes the sacrificial layers SC to expose top and bottom surfaces of the insulation layers 110, the silicon-containing passivation agent 200 may react with the exposed top and bottom surfaces of the insulation layers 110, thereby forming a passivation element on the top and bottom surfaces of the insulation layers 110. In some embodiments, the passivation element 115 on an insulation layer 110 outer sidewall fuses with the passivation layers 115 on the top/bottom surfaces of the insulation layer 110 to form one continuous passivation element 115 covering the insulation layer 110, as illustrated in FIG. 11E. In addition, if semiconductor element 130 surface exposed by a recessed region 142 comprises one or more hydroxyl groups, a passivation element 115 may also be formed on the semiconductor element 130, as shown in FIG. 11E. Accordingly, a passivation element 115 may be conformally formed in one or more recessed regions 142 during formation of the recessed regions 142, as illustrated in FIG. 11E.

Methods of forming data storage elements 150 constituting three-dimensional semiconductor devices according to exemplary embodiments of the inventive concept will be described more fully hereinafter with reference to FIGS. 12A-12F.

According to some exemplary embodiments of the inventive concept, three-dimensional semiconductor devices of the inventive concept may comprise one or more data storage elements 150 disposed between semiconductor elements 130 and conductive elements 160. For example, the three-dimensional semiconductor devices according to some exemplary embodiments may correspond to flash memory devices.

In some embodiments, data storage elements 150 of the inventive concept may comprise a tunnel insulation layer 151, a charge storage layer 153, a first blocking insulation layer 155 and a second blocking insulation layer 157.

Charge storage layers 153 of the inventive concept may comprise any suitable material known in the art. In some embodiments, one or more of the charge storage layers 153 comprises an insulation layer having numerous trap sites and/or a material layer including nano-dots. For example, a charge storage layer 153 may be formed to include one of a trap insulation layer, a floating gate electrode and a material layer including conductive nano-dots. In more detail, the charge storage layer 153 may be formed to include at least one of a silicon nitride layer, a silicon oxynitride layer, a silicon rich nitride layer, a nano-crystalline silicon layer and a laminated trap layer. The charge storage layer 153 may be an insulation layer (e.g., a silicon nitride layer) having numerous charge trap sites therein or a material layer including conductive grains.

Tunnel insulation layers 151 of the inventive concept may comprise any suitable material known in the art. In some embodiments, one or more of the tunnel insulation layers 151 comprises one or more materials having a band gap energy which is greater than that of the charge storage layer 153 and/or one or more materials having a dielectric constant which is less than that of any one of the first blocking insulation layer 155 and the second blocking insulation layer 157. For example, the tunnel insulation layer 151 may comprise an oxide layer, a nitride layer and/or an oxynitride layer. In some embodiments, the tunnel insulation layer 151 is a silicon oxide layer, and one of the first and second blocking insulation layers 155 and 157 is an insulation layer comprising an aluminum oxide layer.

First blocking insulation layers 155 of the inventive concept may comprise any suitable material known in the art. In some embodiments, a first blocking insulation layer 155 comprises a material layer having a band gap energy that is less than that of the tunnel insulation layer 151 and greater than that of the charge storage layer 153.

Second blocking insulation layers 157 of the inventive concept may comprise any suitable material known in the art. In some embodiments, a second blocking insulation layer 157 comprises a material layer having a band gap energy that is less than that of the tunnel insulation layer 151 and greater than that of the charge storage layer 153.

First blocking insulation layers 155 may comprise a different material layer from second blocking insulation layers 157. In some embodiments, a first blocking insulation layer 155 may be formed of a high-k dielectric layer, and a second blocking insulation layer 157 may be formed of a material layer having a lower dielectric constant than the first blocking insulation layer 155. Alternatively, a second blocking insulation layer 157 may be formed of a high-k dielectric layer such as an aluminum oxide layer or a hafnium oxide layer, and a first blocking insulation layer 155 may be formed of a material layer having a lower dielectric constant than the second blocking insulation layer 157.

The layers constituting a data storage element 150 of the inventive concept may be formed using any suitable method(s) known in the art, including, but not limited to, deposition processes (e.g., CVD processes and ALD processes capable of providing excellent step coverage).

Each of the layers constituting a data storage element 150 of the inventive concept may be formed at any suitable locations in a three-dimensional semiconductor device and at any suitable time during the process of manufacturing a three-dimensional semiconductor device. For example, each of the aforementioned layers may be formed in an opening 120 prior to the formation of a semiconductor element 130 in said opening 120 and/or in a recessed region prior to the formation of a conductive element 160 in each of said recessed region 142.

Figure 12A:
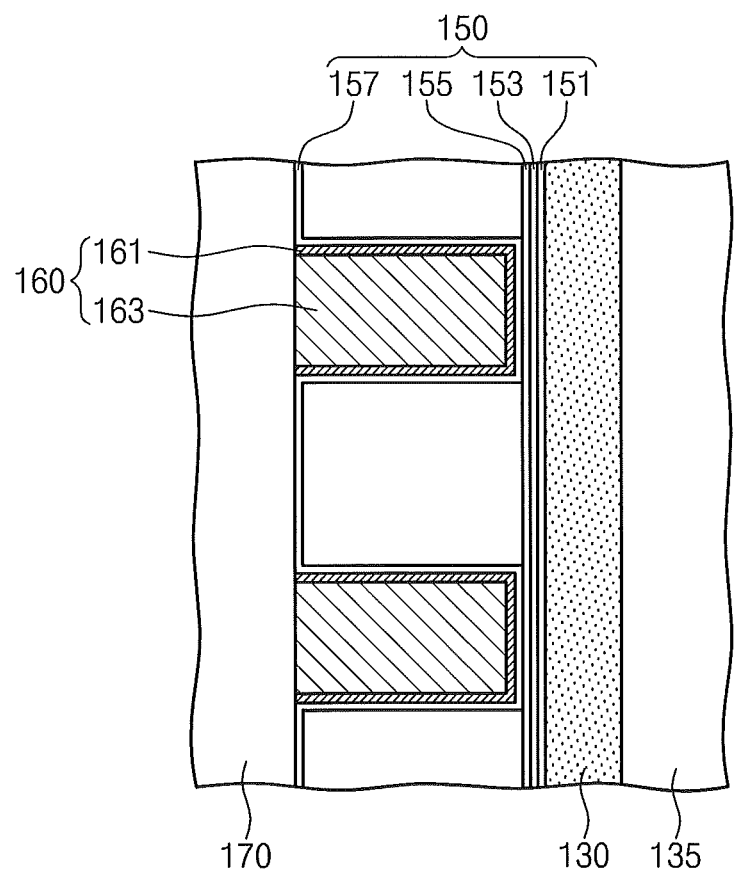
FIGS. 12A-12F are partial cross-sectional views of a three-dimensional semiconductor device, illustrating various aspects of data storage elements and conductive elements according to embodiments of the inventive concept.

As shown in FIG. 12A, a tunnel insulation layer 151, a charge storage layer 153 and a first blocking insulation layer 155 may be formed in an opening 120 prior to formation of a semiconductor element 130 in said opening 120 (refer to FIGS. 3-4). Further, a second blocking insulation layer 157 may be formed to conformally cover the inner walls of one or more recessed regions 142 prior to the formation of a conductive element 160 in each of said one or more recessed regions 142 (refer to FIG. 6).

Figure 12B:
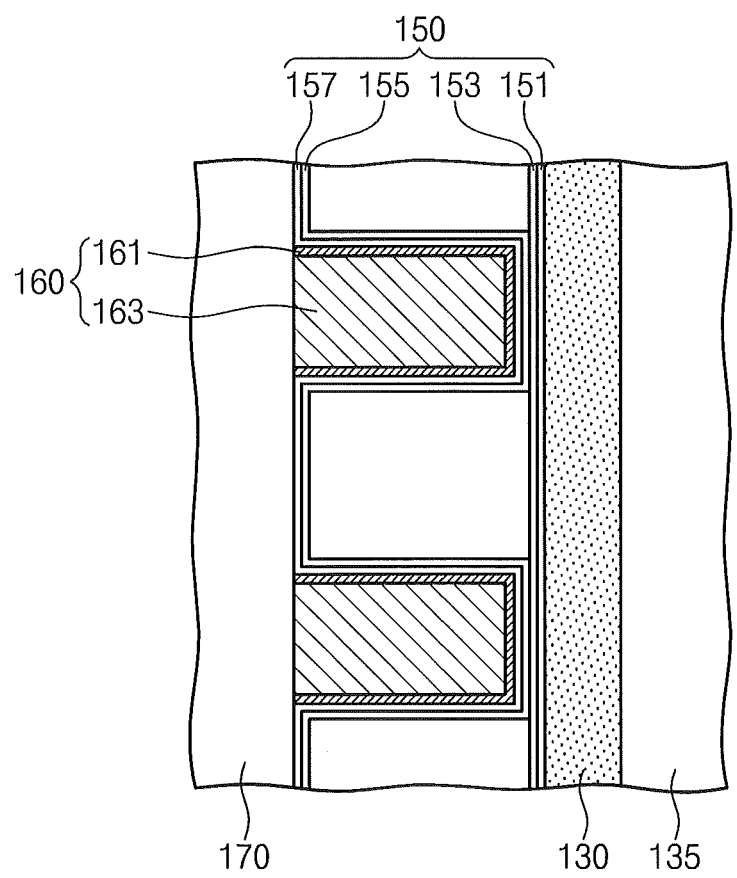

As shown in FIG. 12B, a tunnel insulation layer 151 and a charge storage layer 153 may be formed in an opening 120 prior to formation of a semiconductor element 130 in said opening 120 (refer to FIGS. 3-4). Further, first and second blocking insulation layers 155,157 may be formed to conformally cover the inner walls of one or more recessed regions 142 prior to the formation of a conductive element 160 in each of said one or more recessed regions 142 (refer to FIG. 6).

Figure 12C:
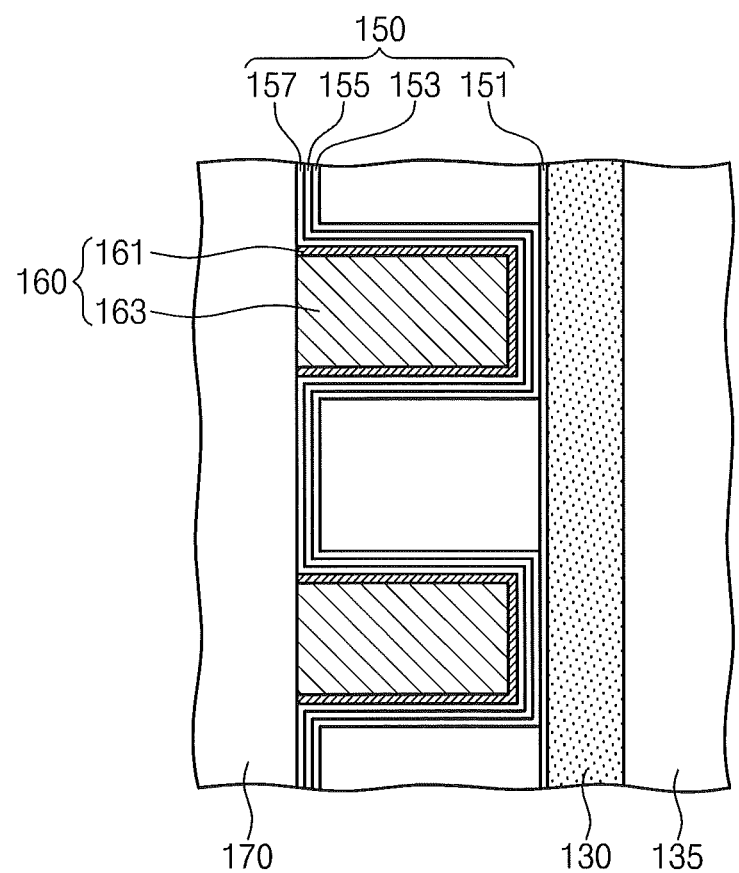

As shown in FIG. 12C, a tunnel insulation layer 151 may be formed in an opening 120 prior to formation of a semiconductor element 130 in said opening 120 (refer to FIGS. 3-4). Further, a charge storage layer 153, a first blocking insulation layer 155 and a second blocking insulation layer 157 may be formed to conformally cover the inner walls of one or more recessed regions 142 prior to the formation of a conductive element 160 in each of said one or more recessed regions 142 (refer to FIG. 6).

Figure 12D:
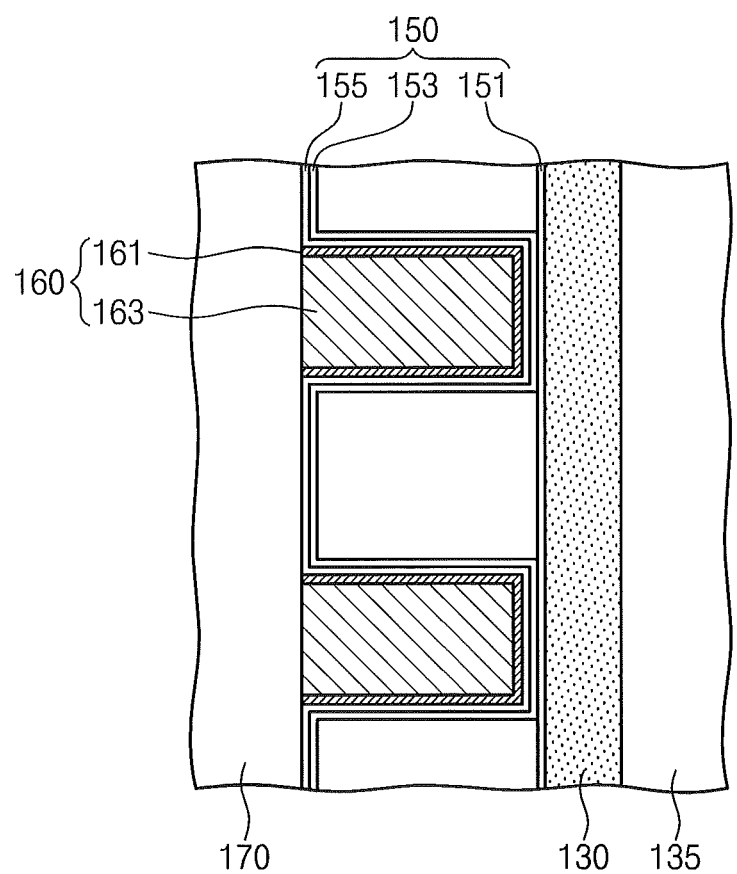
Figure 12E:
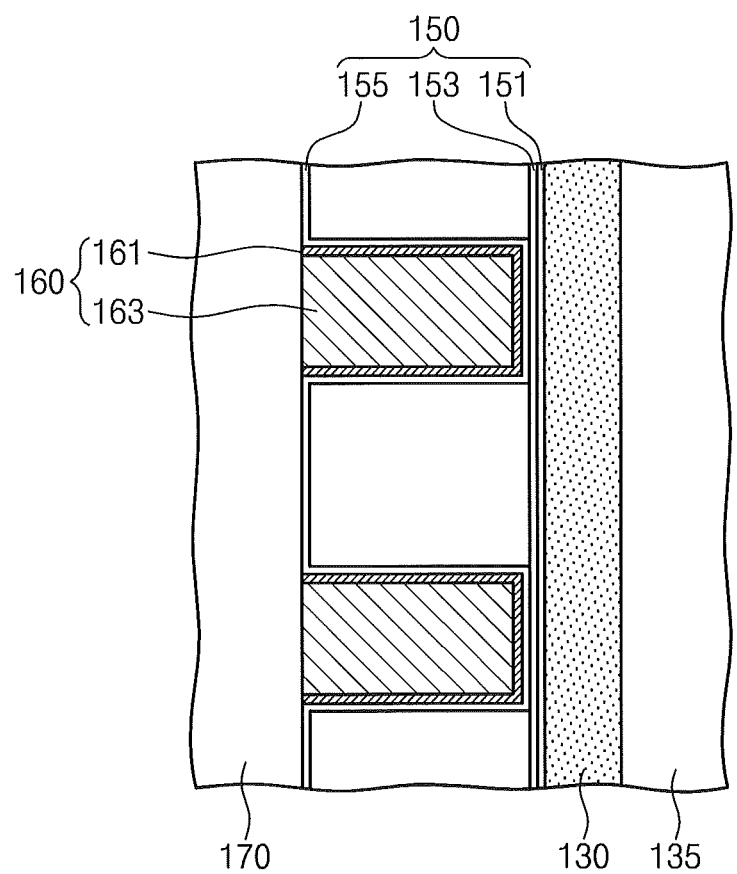
Figure 12F:
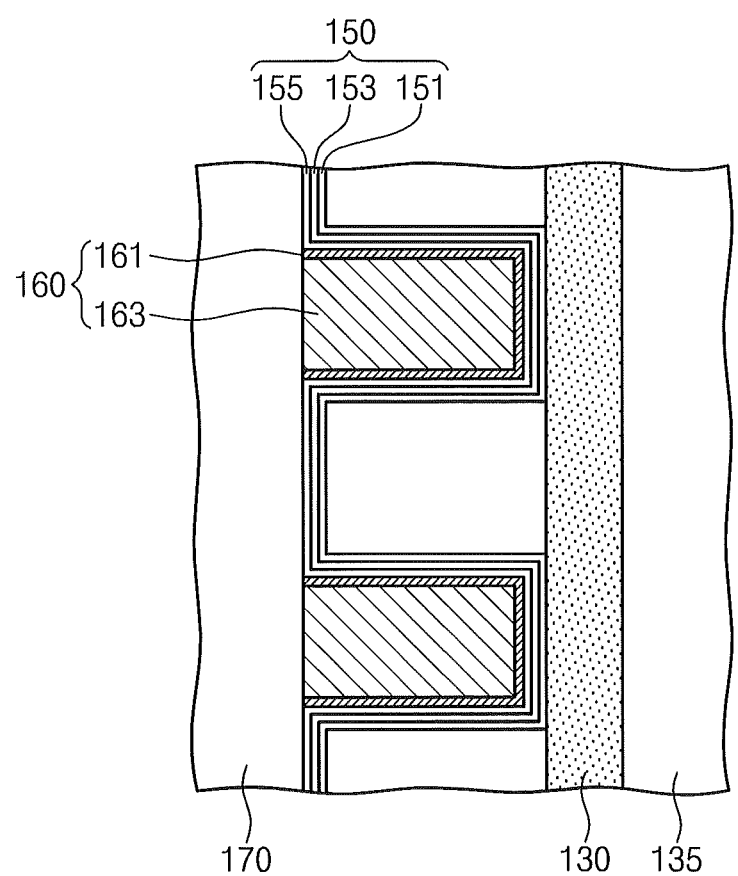

As shown in FIGS. 12D-12F, the data storage layer 150 may be formed to include a tunnel insulation layer 151, a charge storage layer 153 and a blocking insulation layer (e.g., a first blocking insulation layer 155).

Figure 6:
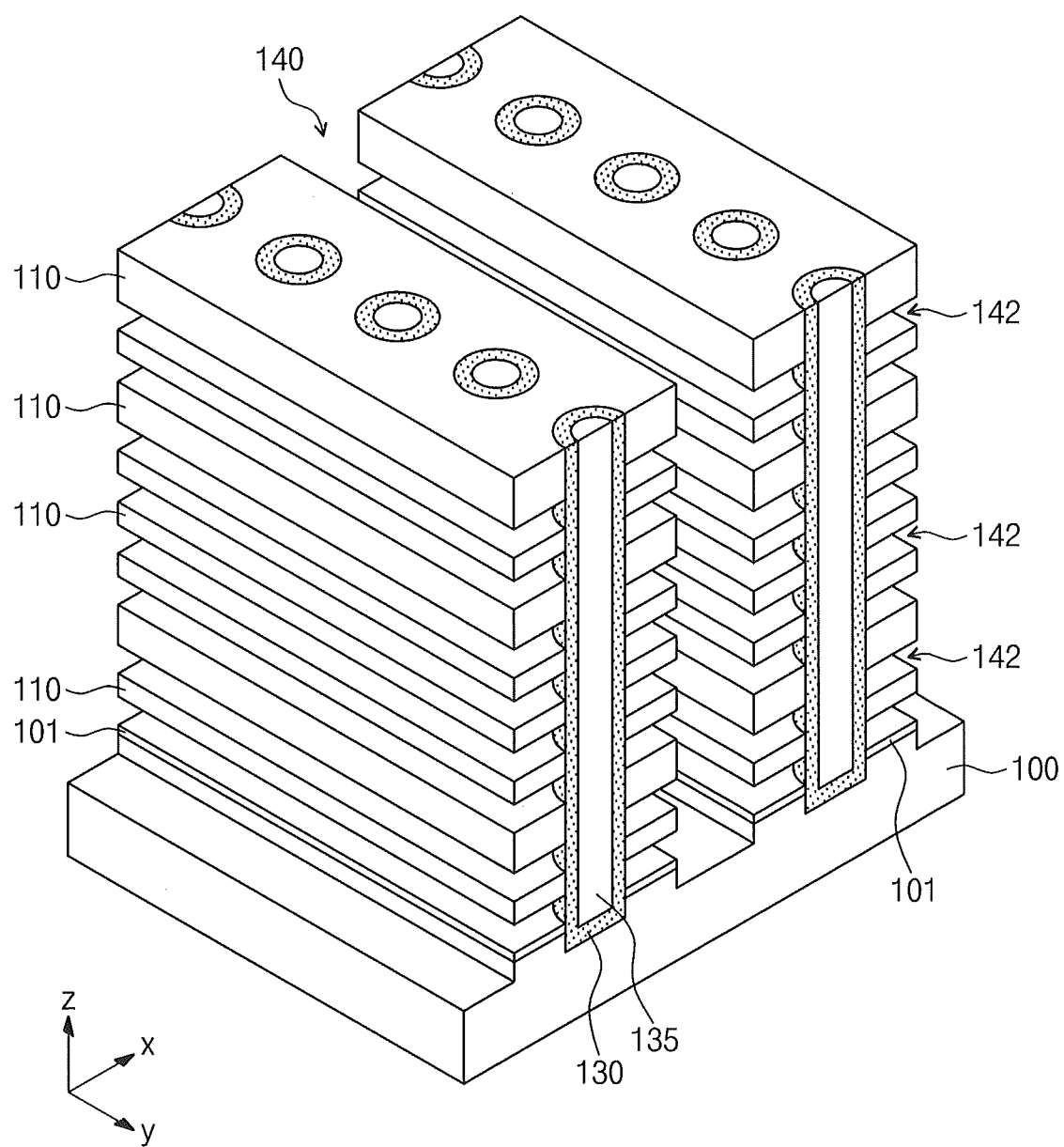

As shown in FIGS. 12D-12E, a tunnel insulation layer 151 may be formed in an opening 120 prior to formation of a semiconductor element 130 in said opening 120 (refer to FIGS. 3-4), and a blocking insulation layer 155 may be formed to conformally cover inner walls of one or more recessed regions 142 prior to the formation of a conductive element 160 in each of said one or more recessed regions 142 (refer to FIG. 6). Further, a charge storage layer 153 may be formed in the openings 120 prior to formation of the tunnel insulation layer 151 (FIG. 12D) or may be formed to conformally cover the inner walls of one or more recessed regions 142 prior to formation of the blocking insulation layer 155 (FIG. 12E).

As shown in FIG. 12F, a tunnel insulation layer 151, a charge storage layer 153 and a blocking insulation layer 155 may be formed to conformally cover the inner walls of one or more recessed regions 142 (refer to FIG. 6).

Methods of increasing the etch selectivity between a sacrificial layer and an insulating layer according to exemplary embodiments of the inventive concept will be described more fully hereinafter.

According to some exemplary embodiments of the inventive concept, the methods of increasing the etch selectivity between a sacrificial layer SC and an insulating layer 110 may comprise forming a passivation element 115 on at least a portion of said insulating layer 110. In some embodiments, forming a passivation element 115 on the insulation layer 110 increases the resistivity of the insulation layer 110 to an etching agent by at least about 5, 10, 15, 20, 25, 30, 40, 50, 60, 70, 80, 90, 100, 125, 150, 175, 200% or more. In some embodiments, the passivation element 115 is selectively formed on the insulation layer 110 (e.g., no passivation element is formed on the sacrificial layer SC).

Any suitable passivation element 115 may be formed on the insulating layer, including, but not limited to, a passivation element 115 as described above. In some embodiments, the passivation element 115 comprises a hydrophobic surface.

Passivation elements 115 of the inventive concept may be formed on the insulation layer 110 using any suitable method known in the art, including, but not limited to, the methods described above. In some embodiments, the passivation element 115 is formed on the insulation layer 110 by contacting the insulation layer 110 with passivation agent. In some embodiments, a silicon- and/or hydrocarbon-containing passivation agent is contacted with the insulation layer 110 as part of a composition that also comprises an etching agent capable of removing at least a portion of the sacrificial layer SC (e.g., an etching agent comprising phosphoric acid).

Any suitable passivation agent may be used to form a passivation element 115 on the insulation layer 110, including, but not limited to, the passivation agents described above. In some embodiments, the passivation agent comprises silicon and/or one or more hydrocarbons. In some embodiments, the passivation agent is a silicon-containing passivation agent 200 selected from the group consisting of HMDS, TMS-DMA, TMSDEA, TMDS and DMSEA.

Passivation elements and methods of the inventive concept may be used to form any suitable semiconductor device, including, but not limited to, phase change memory devices, resistive memory devices, ferroelectric memory devices or magnetic memory devices. For example, in the event that the data storage layer 150 between the semiconductor elements 130 and the conductive patterns 160 is replaced with a phase changeable material layer, a variable resistive material layer such as a transition metal oxide layer, a ferroelectric material layer or a ferromagnetic material layer, the memory cells of the semiconductor devices according to the exemplary embodiments may be used as phase change memory cells, resistive memory cells, ferroelectric memory cells or magnetic memory cells. In this case, the semiconductor elements 130 may be replaced with conductive patterns.

Figure 13:
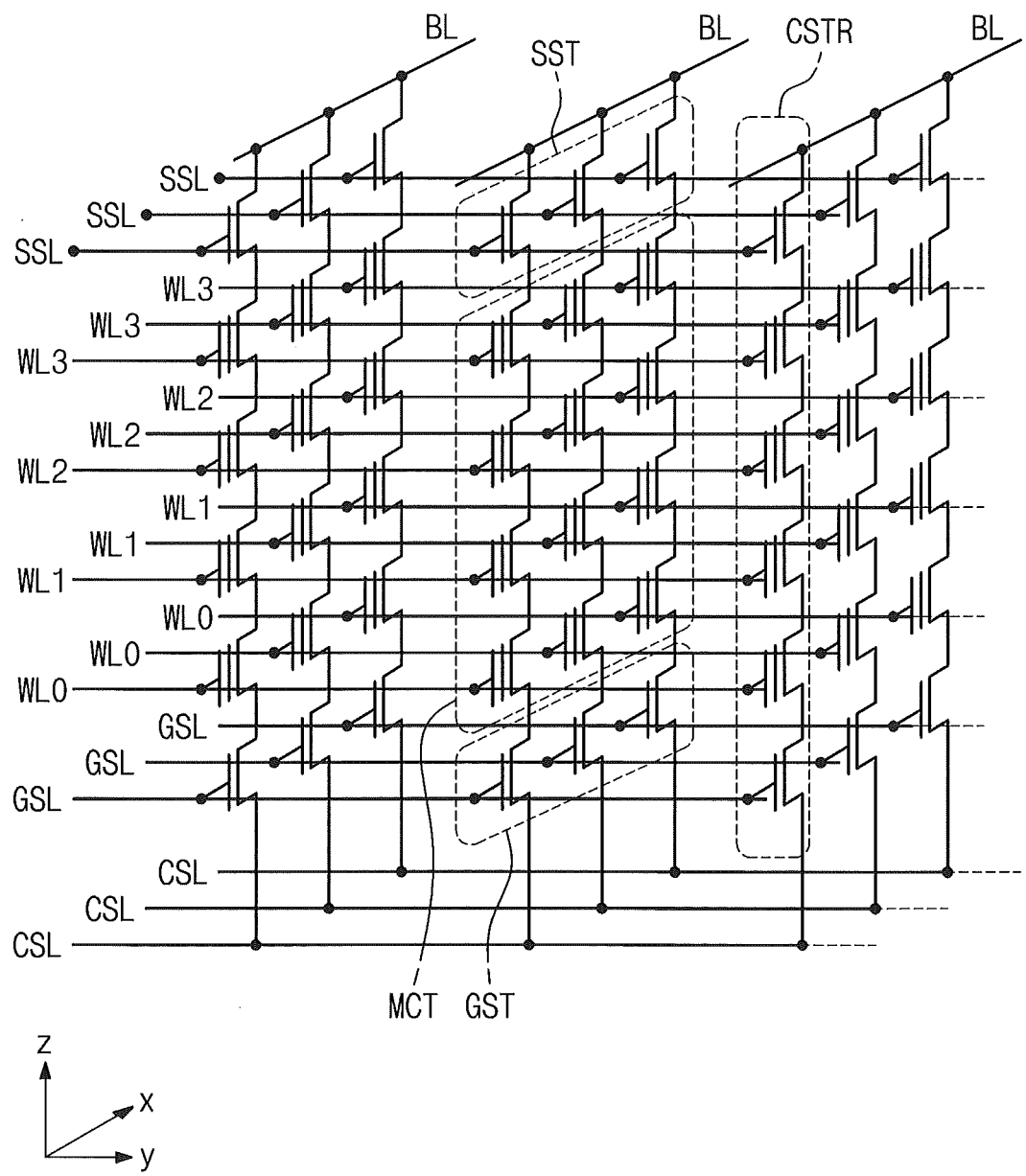
FIG. 13 is an equivalent circuit diagram illustrating a portion of a three-dimensional semiconductor device according to embodiments of the inventive concept.

FIG. 13 is an equivalent circuit diagram illustrating a cell array portion of a three-dimensional semiconductor device according to exemplary embodiments of the inventive concept.

As shown in FIG. 13, a cell array portion of a three-dimensional semiconductor device according to an exemplary embodiment may include common source lines CSL, bit lines BL, and a plurality of cell strings CSTR disposed between the source lines CSL and the bit lines BL.

The bit lines BL may be two dimensionally arrayed, and two or more cell strings CSTR may be electrically connected in parallel to each of the bit lines BL. Each cell string CSTR may be electrically connected to any one of the common source lines CSL. That is, the plurality of cell strings CSTR may be disposed between the bit lines BL and the common source lines CSL. In an embodiment, the common source lines CSL may be two dimensionally arrayed. The common source lines CSL may be electrically connected to each other and may be simultaneously controlled to have the same electrical bias, for example, the same voltage. Alternatively, the common source lines CSL may be isolated from each other and may be independently controlled.

Each of the cell strings CSTR may be configured to include one or more ground selection transistors GST connected to one of the common source lines CSL, one or more string selection transistors SST connected to one of the bit lines BL, and one or more memory cell transistors MCT disposed between the ground selection transistor GST and the string selection transistor SST. The ground selection transistor(s) GST, memory cell transistor(s) MCT and the string selection transistor(s) SST constituting each of the cell strings CSTR may be serially connected to each other.

In some embodiments, each of the common source lines CSL may be electrically connected to one or more sources of the ground selection transistors GST. In addition, gate electrodes of the ground selection transistors GST may extend to form ground selection lines GSL, and gate electrodes of the string selection transistors SST may extend to form string selection lines SSL. Further, gate electrodes of the memory cell transistors MCT may extend to form a plurality of word lines WL0 to WL3. The ground selection lines GSL, the string selection lines SSL and the word lines WL0 to WL3 may be disposed between the common source lines CSL and the bit lines BL. Each of the memory cell transistors MCT may act as a data storage element.

Figure 14:
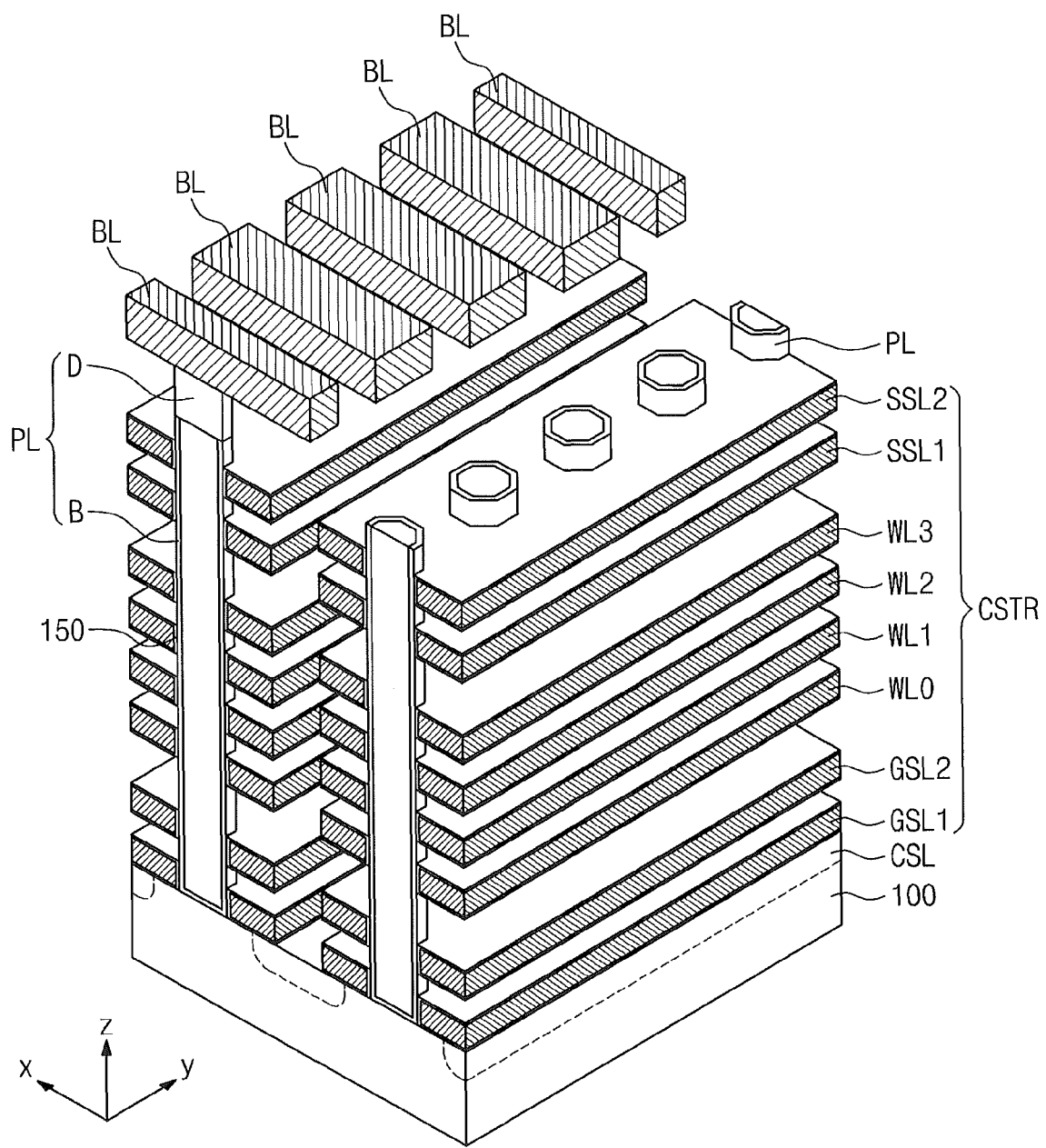
FIG. 14 is a perspective view illustrating a portion of a three-dimensional semiconductor device according to embodiments of the inventive concept.

FIG. 14 is a perspective view illustrating a cell array portion of a three-dimensional semiconductor device according to exemplary embodiments of the inventive concept.

As shown in FIG. 14, common source lines CSL of the inventive concept may comprise impurity regions 105 disposed in a substrate 100 (refer to FIG. 8). Alternatively, the common source lines CSL may be conductive lines disposed on a substrate 100. The bit lines BL may be disposed over the substrate 100 and may be spaced apart from the substrate 100. The bit lines BL may be upper interconnection lines 180 (refer to FIG. 8). The bit lines BL may be two dimensionally arrayed and some of the cell strings CSTR may be connected in parallel to each of the bit lines BL. Thus, the cell strings CSTR may be two dimensionally arrayed on the common source lines CSL or the substrate 100.

In an exemplary embodiment, each of the ground selection lines GSL may include a first and a second ground selection lines GSL1 and GSL2, and each of the string selection lines SSL may include a first and a second string selection lines SSL1 and SSL2. That is, each of the cell strings CSTR may include a first ground selection transistor GSL1, a second ground selection transistor GLS2, a plurality of memory cell transistors MCT, a first string selection transistor SSL1 and a second string selection transistor SSL2 that are serially connected to one another and are disposed between one of the bit lines BL and one of the common source lines CSL. Thus, the first and second ground selection lines GSL1 and GSL2, the word lines WL0 to WL3, and the first and second string selection lines SSL1 and SSL2 may be disposed between the bit lines BL and the common source lines CSL. The first and second ground selection lines GSL1 and GSL2, the word lines WL0 to WL3, and the first and second string selection lines SSL1 and SSL2 may be conductive patterns which are stacked on the substrate 100.

Further, each of the cell strings CSTR may include a semiconductor pillar (e.g., a vertical semiconductor pattern) PL that vertically extends from any one of the common source line CSL to be electrically connected to one of the bit lines BL (refer to FIG. 4). The semiconductor pillars PL may penetrate the ground selection lines GSL1 and GSL2, the word lines WL0 to WL3, and the string selection lines SSL1 and SSL2. That is, the semiconductor pillars PL may penetrate the conductive patterns stacked on the substrate 100. In addition, each of the semiconductor pillars PL may include a body B and at least one impurity region formed in one end (or in both ends) of the semiconductor pillar PL. For example, the impurity regions formed in upper ends of the semiconductor pillar PL may correspond to drain regions D.

Figure 7:
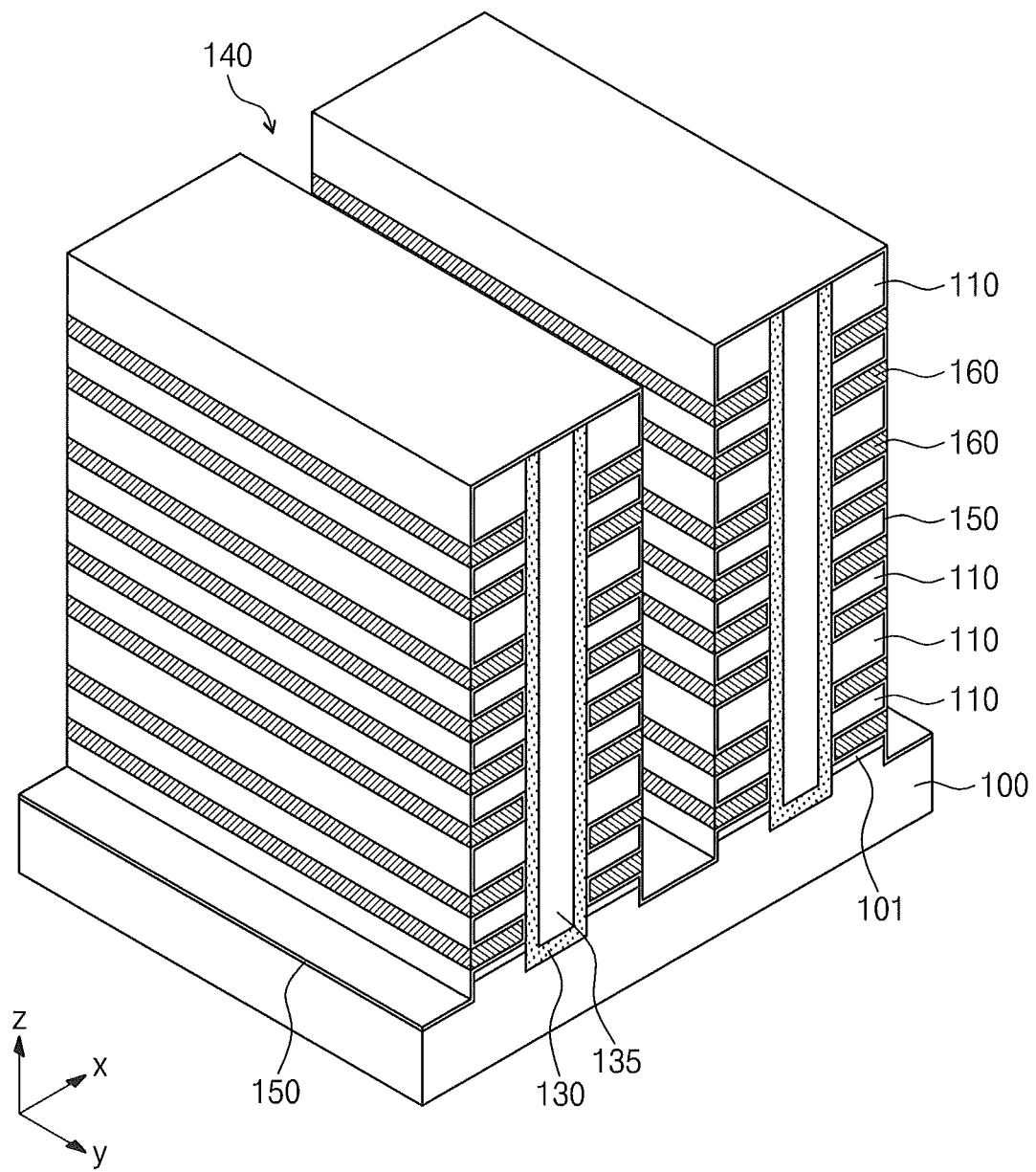

A data storage element 150 may be disposed between the word lines WL0 to WL3 and the semiconductor pillars PL (refer to FIG. 7). In an embodiment, the data storage element 150 may be a charge storage layer 153 (refer to FIGS. 12A-12F). For example, the data storage element 150 may be a material layer including one of a trap insulation layer, a floating gate electrode and conductive nano-dots. Data stored in the data storage element 150 may be changed using a Fowler-Nordheim (FN) tunneling phenomenon occurred by a voltage difference between the semiconductor pillars PL and the word lines WL0 to WL3. Alternatively, the data storage layer 150 may include another material layer in which data are stored by a different mechanism from the FN tunneling phenomenon. For example, the data storage layer 150 may be a phase change material used in phase change memory cells (e.g., PRAM cells) or a variable resistive material used in resistive memory cells (e.g., RRAM cells).

A dielectric layer used as a gate insulation layer of the selection transistors may be disposed between the semiconductor pillars PL and the ground selection lines GSL1 and GSL2 as well as between the semiconductor pillars PL and the string selection lines SSL1 and SSL2. The dielectric layer may be formed of the same material layer as the data storage layer 150. Alternatively, the dielectric layer may be formed of a gate insulation layer of typical MOS transistors. For example, the dielectric layer may be formed of a silicon oxide layer.

The semiconductor pillars PL, the ground selection lines GSL1 and GSL2, the word lines WL0 to WL3, and the string selection lines SSL1 and SSL2 may constitute ground selection transistors GST, memory cell transistors MCT and string selection transistors SST, respectively. That is, the semiconductor pillars PL may act as channel bodies of the ground selection transistors GST, the memory cell transistors MCT and the string selection transistors SST. Thus, the ground selection lines GSL1 and GSL2, the word lines WL0 to WL3, and the string selection lines SSL1 and SSL2 may be used as gate electrodes of the ground selection transistors GST, the memory cell transistors MCT and the string selection transistors SST. In an embodiment, impurity regions acting as source/drain regions may be formed in the semiconductor pillars PL between the gate electrodes (e.g., the ground selection lines GSL1 and GSL2, the word lines WL0 to WL3, and the string selection lines SSL1 and SSL2).

Alternatively, the impurity regions in the semiconductor pillars PL between the gate electrodes (e.g., the selection lines and the word lines) may not be formed. In this case, the energy band profiles of the semiconductor pillars PL may be controlled only by voltages applied to the ground selection lines GSL1 and GSL2, the word lines WL0 to WL3, and the string selection lines SSL1 and SSL2.

Specifically, when a voltage applied to the word lines WL0 to WL3 is higher than a threshold voltage of memory cell transistors MCT, inversion layers (e.g., channel regions) may be formed in the semiconductor pillars PL adjacent to the word lines WL0 to WL3. Further, the inversion layers may extend into the semiconductor pillars PL between the word lines WL0 to WL3. This may be due to fringe fields generated by the word line voltages. A maximum width (e.g., a vertical width) of each of the inversion layers may be greater than a vertical thickness of the corresponding word line. Thus, the inversion layers in each of the semiconductor pillars PL may be vertically connected to each other, thereby acting as a current path electrically connecting the common source line CSL to the corresponding one of the bit lines BL. Accordingly, the cell strings CSTR may normally operate even though the impurity regions acting as source/drain regions are not formed in the semiconductor pillars PL between the word lines WL0 to WL3.

As described above, the ground selection transistors GST, the memory cell transistors MCT and the string selection transistors SST in each of the cell strings CSTR may be electrically connected to each other in series even without formation of the impurity regions in the semiconductor pillars PL.

Semiconductor devices of the inventive concept may be incorporated into any suitable electronic system, including, but not limited to, personal digital assistants (PDAs), portable computers, web tablets, wireless phones, mobile phones, digital music players or memory cards. The electronic system may also be applied to electronic products that receive or transmit information data by wireless means.

Figure 15:
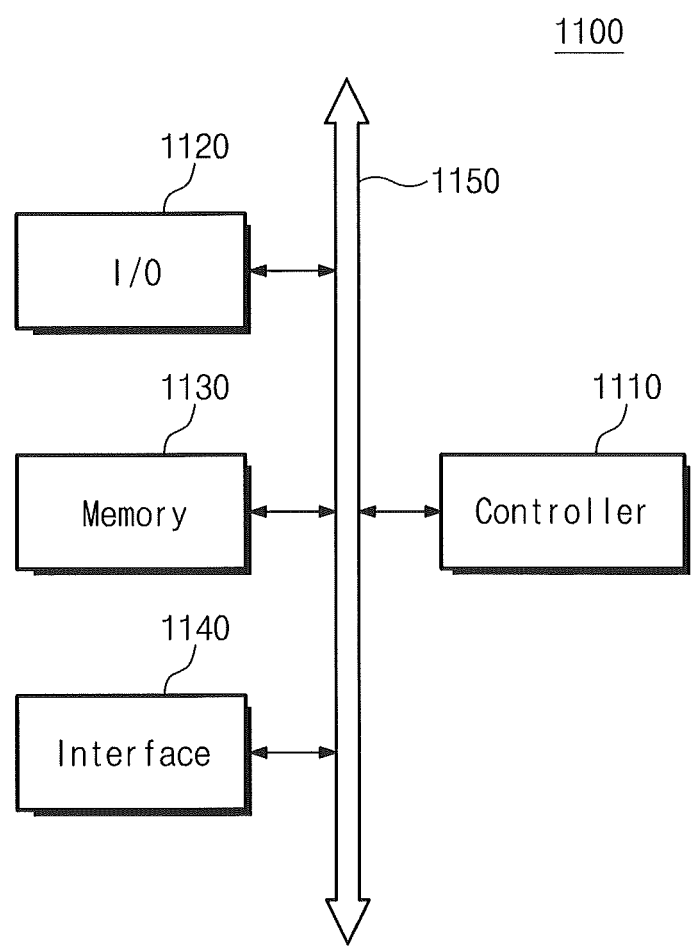
FIG. 15 is a block diagram of an electronic system according to embodiments of the inventive concept.

FIG. 15 is a schematic block diagram illustrating an example of electronic systems including semiconductor devices according to some exemplary embodiments.

As shown in FIG. 15, an electronic system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. That is, the data bus 1150 may correspond to a path through which electrical signals are transmitted.

The controller 1110 may include at least one of a microprocessor, a digital signal processor (DSP), a microcontroller or the like. The memory device 1130 may store commands executed by the controller 1110. The I/O unit 1120 may receive data or signals from an external device or may transmit data or signals to the external device. The I/O unit 1120 may include a keypad, a keyboard or a display unit.

The memory device 1130 may include at least one of the semiconductor devices according to the exemplary embodiments described above. The memory device 1130 may further include another type of semiconductor memory devices which are different from the semiconductor devices described in the above embodiments. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from the communication network.

The three-dimensional semiconductor devices according to the exemplary embodiments described above may be encapsulated using various packaging techniques. For example, the semiconductor devices according to the aforementioned exemplary embodiments may be encapsulated using any one of a package on package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique.

Figure 16:
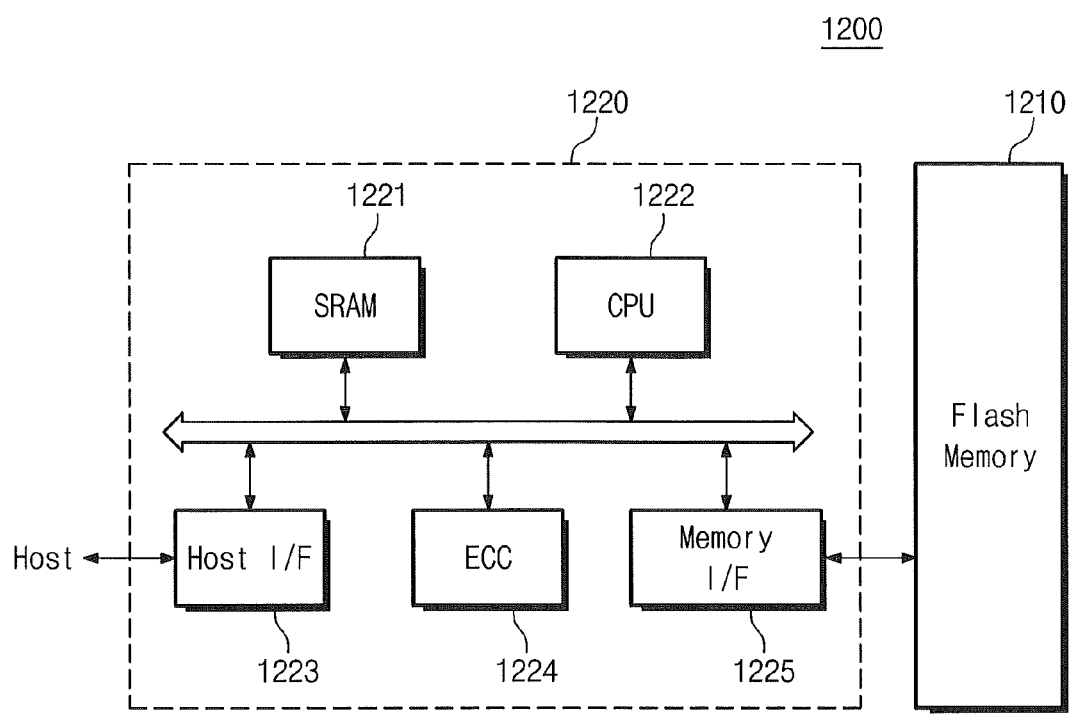
FIG. 16 is a block diagram of a memory card according to embodiments of the inventive concept.

FIG. 16 is a schematic block diagram illustrating an example of memory cards including the semiconductor devices according to the exemplary embodiments.

Referring to FIG. 16, a memory card 1200 may include a flash memory device 1210 having at least one of the semiconductor memory devices according to the exemplary embodiments described above. The memory card 1200 may be used as a data storage media for storing a large capacity of data. The memory card 1200 may further include a memory controller 1220 that controls data communication between a host and the flash memory device 1210.

The memory controller 1220 may include a static random access memory (SRAM) device 1221, a central processing unit (CPU) 1222, a host interface unit 1223, an error check and correction (ECC) block 1224 and a memory interface unit 1225. The SRAM device 1221 may be used as an operation memory of the CPU 1222. The host interface unit 1223 may be configured to include a data communication protocol between the memory card 1200 and the host. The ECC block 1224 may detect and correct errors of data which are read out from the flash memory device 1210. The memory interface unit 1225 may connect the memory controller 1220 to the memory device 1210. The central processing unit (CPU) 1222 may control overall operations for data communication of the memory controller 1220. Even though not shown in the drawings, the memory card 1200 may further include a read only memory (ROM) device that stores code data to interface with the host.

Figure 17:
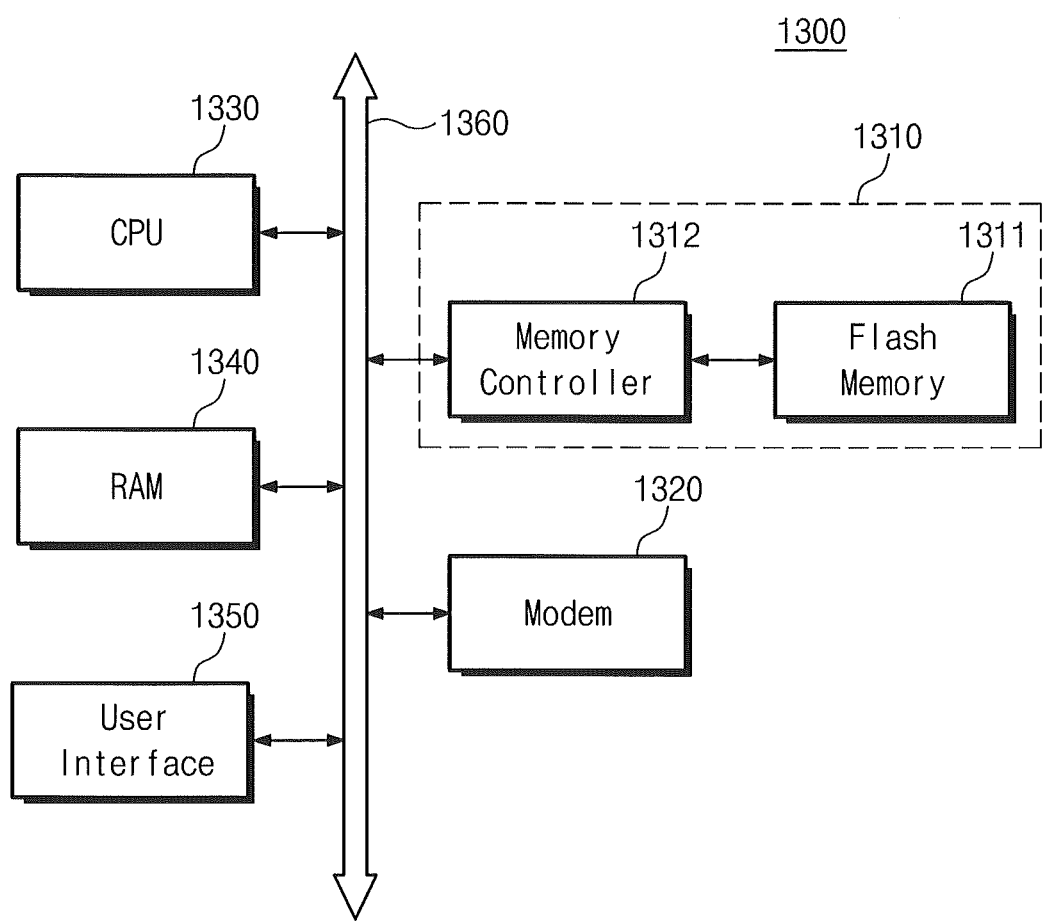
FIG. 17 is a block diagram of an information processing system according to embodiments of the inventive concept.

FIG. 17 is a block diagram illustrating an example of information processing systems including the semiconductor devices according to the exemplary embodiments.

Referring to FIG. 17, an information processing system 1300 may be a mobile system, a desk top computer or the like. The information processing system 1300 may include a flash memory unit 1310 having at least one of the flash memory devices according to the exemplary embodiments described above. The information processing system 1300 may further include a modulator-demodulator (MODEM) 1320, a central processing unit (CPU) 1330, a random access memory (RAM) device 1340 and a user interface unit 1350. At least two of the flash memory unit 1310, the MODEM 1320, the CPU 1330, the RAM device 1340 and a user interface unit 1350 may communicate with each other through a data bus 1360. The flash memory unit 1310 may have substantially the same configuration as the electronic system 1100 illustrated in FIG. 15 or the memory card 1200 illustrated in FIG. 16. That is, the flash memory unit 1310 may include a flash memory device 1311 and a memory controller 1312 that controls overall operations of the flash memory device 1311.

The flash memory unit 1310 may store data processed by the CPU 1330 or data transmitted from an external system. The flash memory unit 1310 may be configured to include a solid state disk (SSD). In this case, the flash memory unit 1310 constituting the information processing system 1300 may stably and reliably store a large capacity of data. If the reliability of the flash memory unit 1310 is improved, the information processing system 1300 may save sources that are required to check and correct data. As a result, the information processing system 1300 may provide fast data communication. Even though not shown in the drawings, the information processing system 1300 may further include a camera image processor, an application chipset and/or an input/output unit.

According to the embodiments set forth above, sacrificial layers SC and insulation layers 110 may be alternately and repeatedly stacked to form a stack structure ST, and the stack structure ST may be patterned to form a trench 140 exposing sidewalls of the patterned sacrificial layers SC and the patterned insulation layers 110. Further, a passivation element 115 may be formed on at least the exposed sidewalls of the patterned insulation layers 110. Accordingly, the passivation element 115 can prevent a thickness of the patterned insulation layers 110 from being varied while the patterned sacrificial layers SC are removed in a subsequent process. Further, while the patterned sacrificial layers SC are removed, an etch selectivity between the patterned sacrificial layers SC and the patterned insulation layers 110 can be improved because of the presence of the passivation element 115.

The foregoing is illustrative of embodiments of the inventive concept and is not to be construed as limiting thereof. Although a few embodiments have been described, those skilled in the art will readily appreciate that many modifications are possible in embodiments without materially departing from the novel teachings and advantages of the inventive concept. Accordingly, all such modifications are intended to be included within the scope of this inventive concept as defined in the claims.

In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor device, comprising:
   forming a stack structure on a substrate, said stack structure comprising a plurality of sacrificial layers and a plurality of insulation layers, wherein the sacrificial layers and the insulation layers are alternately stacked such that at least one sacrificial layer is interposed between insulation layers in the stack;
   forming a plurality of openings in said stack structure;
   forming a plurality of semiconductor elements in said stack structure, wherein each semiconductor element is formed in one of said plurality of openings;
   forming a trench in said stack structure, wherein formation of said trench creates one or more exposed surfaces in each sacrificial layer and one or more exposed surfaces in each insulation layer;
   forming one or more passivation elements in said stack structure, wherein each passivation element is formed on one or more of the exposed insulation layer surfaces;
   forming one or more recessed regions in said stack structure, wherein each recessed region is formed by removing at least a portion of one of said plurality of sacrificial layers;
   forming one or more conductive elements in said stack structure, wherein each of said conductive elements is formed in one of said one or more recessed regions wherein said passivation element(s) and said recessed region(s) are formed concurrently.

2. The method of claim 1, wherein each of said one or more passivation elements prevents the underlying insulation layer surface(s) from being directly exposed to an agent used to form said one or more recessed regions.

3. The method of claim 1, wherein forming one or more passivation elements comprises a silylation reaction between a hydroxyl (—OH) group on an exposed insulation layer surface and a silicon-containing passivation agent.

4. The method of claim 3, wherein said silicon-containing passivation agent comprises one or more hydrocarbon groups.

5. The method of claim 1, wherein forming one or more passivation elements comprises an alkylation reaction between an exposed insulation layer surface and a hydrocarbon-containing passivation agent.

6. The method of claim 5, wherein said hydrocarbon-containing passivation agent comprises a gas.

7. The method of claim 1, wherein forming one or more passivation elements comprises forming a passivation element on each of the insulation layer surfaces that was exposed during the formation of said trench.

8. The method of claim 1, wherein forming one or more passivation elements comprises increasing a resistivity of said plurality of insulation layers to an etching agent by at least about 50%.

9. The method of claim 1, wherein concurrently forming the passivation element(s) and the recessed region(s) comprises selectively etching one or more of the sacrificial layers in the presence of a passivation agent.

10. The method of claim 1, further comprising removing one or more of said passivation elements prior to forming one or more conductive elements in said stack structure.

11. The method of claim 1, further comprising forming one or more data storage elements prior to forming one or more conductive elements, wherein each of said data storage elements is formed in one of said one or more recessed regions.

12. A method of manufacturing a semiconductor device, comprising:
   forming a stack structure on a substrate, said stack structure comprising a plurality of sacrificial layers and a plurality of insulation layers, wherein the sacrificial layers and the insulation layers are alternately and repeatedly stacked;
   forming a trench in said stack structure, thereby creating one or more exposed sidewalls in each sacrificial layer and one or more exposed sidewalls in each insulation layer;
   selectively forming hydrophobic passivation elements in said trench, wherein the hydrophobic passivation elements are formed on said exposed sidewalls of said insulation layers to expose said exposed sidewalls of the sacrificial layers;
   etching said exposed sidewalls of said sacrificial layers, thereby forming recessed regions between said insulation layers; and
   forming conductive patterns in respective ones of said recessed regions.

13. The method of claim 12,
wherein one or more hydroxyl (—OH) groups is present on each of the exposed insulation layer sidewalls,
wherein forming hydrophobic passivation elements comprises contacting the exposed surface of an insulation layer with a silicon-containing passivation agent, and
wherein said silicon-containing passivation agent is selected from the group consisting of hexa-methyl-di-silazane (HMDS), tri-methyl-silyl-di-methyl-amine (TMSDMA), tri-methyl-silyl-di -ethyl-amine (TMS-DEA), tetra-methyl-di-silazane (TMDS) and di-methyl-silyl-ethyl-amine (DMSEA).

14. The method of claim 12, wherein selectively forming the hydrophobic passivation elements comprises forming the hydrophobic passivation elements on said exposed sidewalls of said insulation layers without forming the hydrophobic passivation elements on said sacrificial layers.

\* \* \* \* \*